United States Patent
Scheer et al.

(10) Patent No.: US 8,097,402 B2
(45) Date of Patent: Jan. 17, 2012

(54) USING ELECTRIC-FIELD DIRECTED POST-EXPOSURE BAKE FOR DOUBLE-PATTERNING (D-P)

(75) Inventors: Steven Scheer, Austin, TX (US); Mark Somervell, Austin, TX (US)

(73) Assignee: Tokyo Electron Limited (JP)

( * ) Notice: Subject to any disclaimer, the term of this patent is extended or adjusted under 35 U.S.C. 154(b) by 480 days.

(21) Appl. No.: 12/415,505

(22) Filed: Mar. 31, 2009

(65) Prior Publication Data

US 2010/0248152 A1  Sep. 30, 2010

(51) Int. Cl.
*G03F 7/20* (2006.01)

(52) U.S. Cl. ................................. 430/394; 430/311

(58) Field of Classification Search ............ 430/394, 430/311, 322
See application file for complete search history.

(56) References Cited

U.S. PATENT DOCUMENTS

| | | | |
|---|---|---|---|
| 5,158,861 A | 10/1992 | Tokui et al. | |
| 5,258,266 A | 11/1993 | Tokui et al. | |
| 6,242,164 B1 | 6/2001 | Choi et al. | |
| 6,441,298 B1 | 8/2002 | Thio | |
| 6,686,132 B2 * | 2/2004 | Cheng et al. | 430/325 |
| 6,900,123 B2 | 5/2005 | Jiang et al. | |
| 2005/0074706 A1 | 4/2005 | Bristol et al. | |
| 2006/0037701 A1 | 2/2006 | Koshiishi et al. | |
| 2006/0216649 A1 * | 9/2006 | Paxton et al. | 430/311 |
| 2006/0257786 A1 * | 11/2006 | Larson et al. | 430/270.1 |
| 2007/0226674 A1 | 9/2007 | Haffner et al. | |
| 2007/0250200 A1 | 10/2007 | Scheer et al. | |
| 2008/0032508 A1 | 2/2008 | Chang | |

OTHER PUBLICATIONS

International Search Report for International Application No. PCT/US2010/027874.

* cited by examiner

*Primary Examiner* — Kathleen Duda
*Assistant Examiner* — Brittany Raymond

(57) ABSTRACT

The invention provides a method of processing a substrate using Double-Patterning (D-P) processing sequences and Electric-Field Enhanced Layers (E-FELs). The D-P processing sequences and E-FELs can be used to create lines, trenches, vias, spacers, contacts, and gate structures using a minimum number of etch processes.

20 Claims, 7 Drawing Sheets

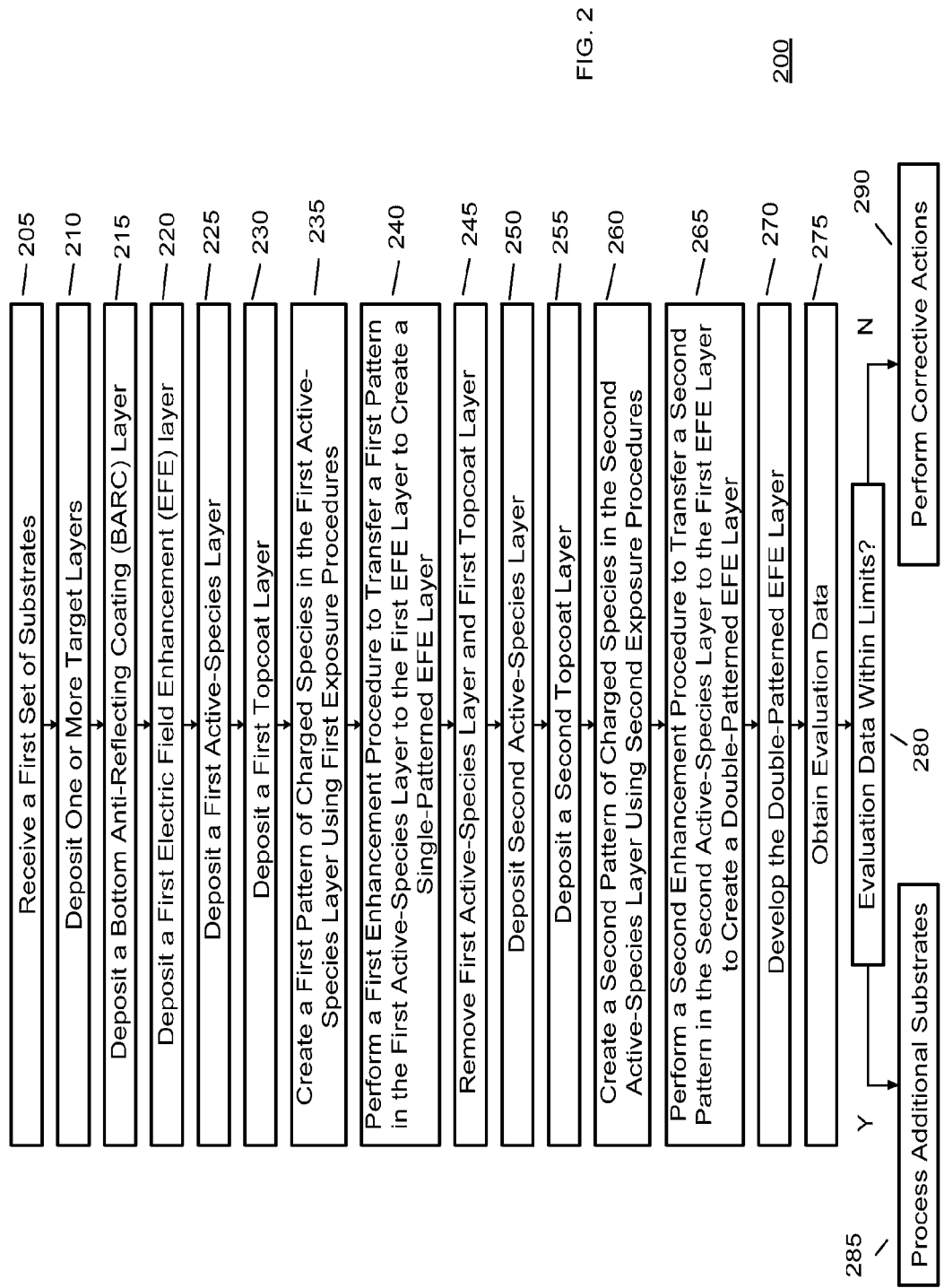

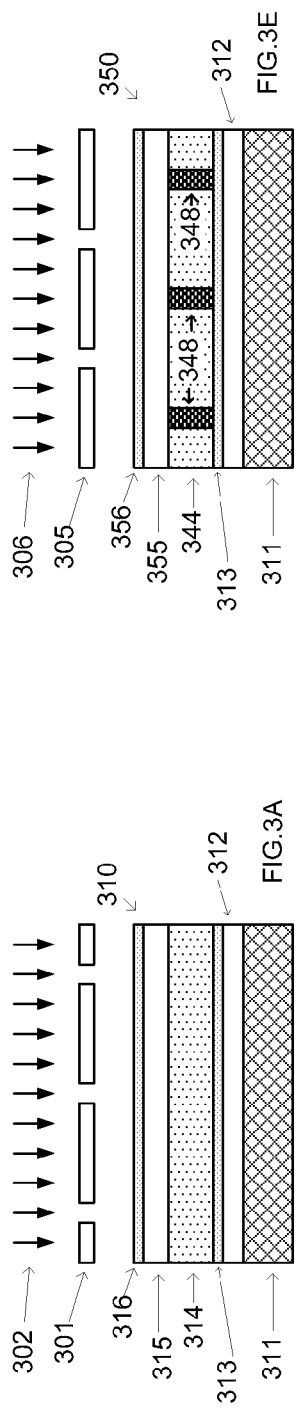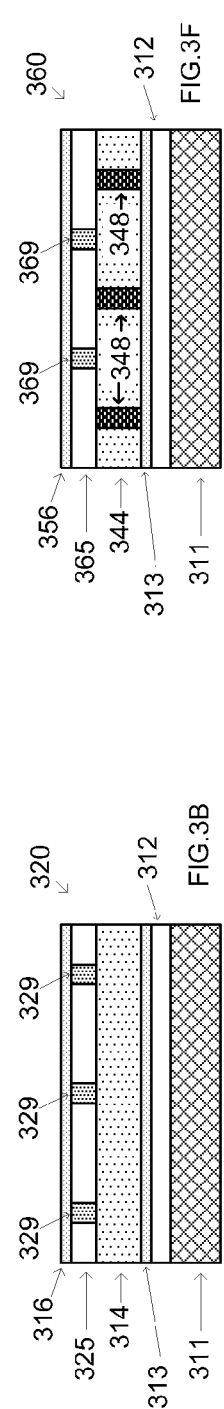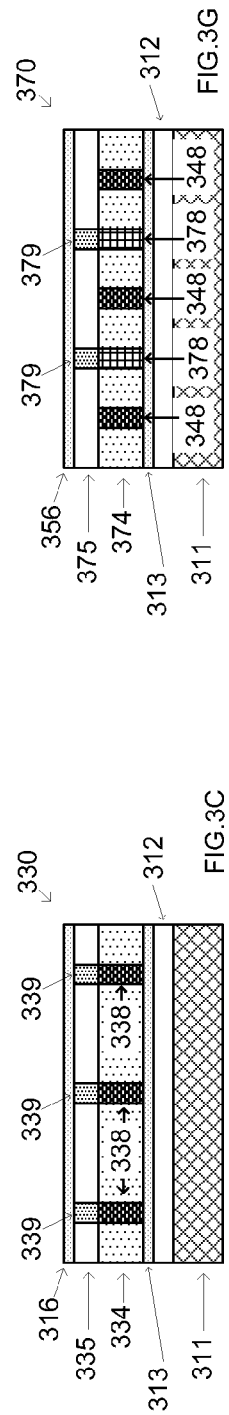

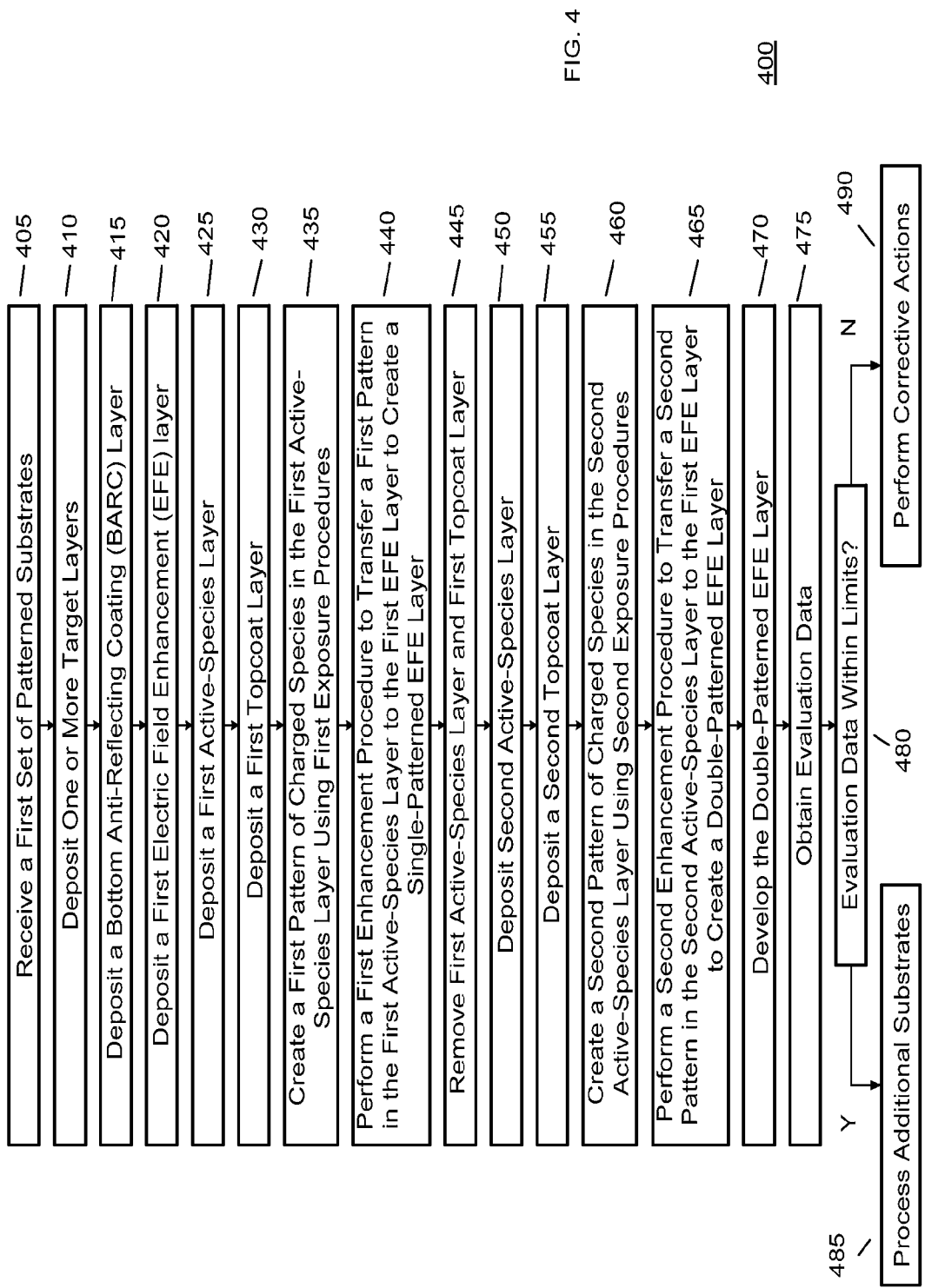

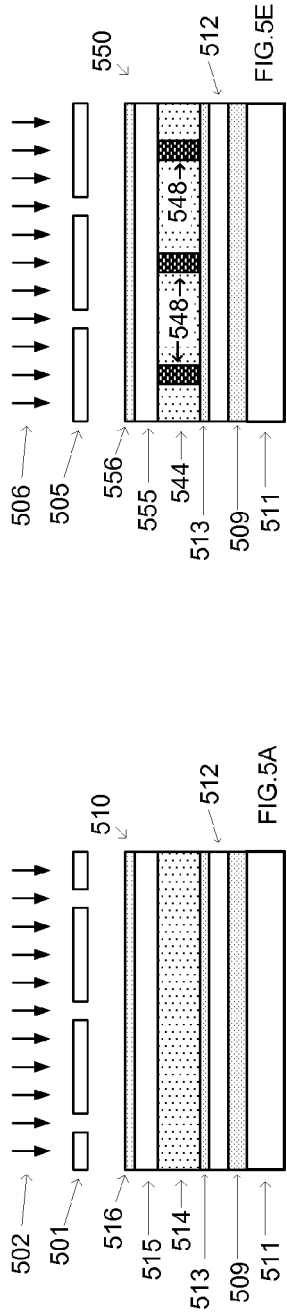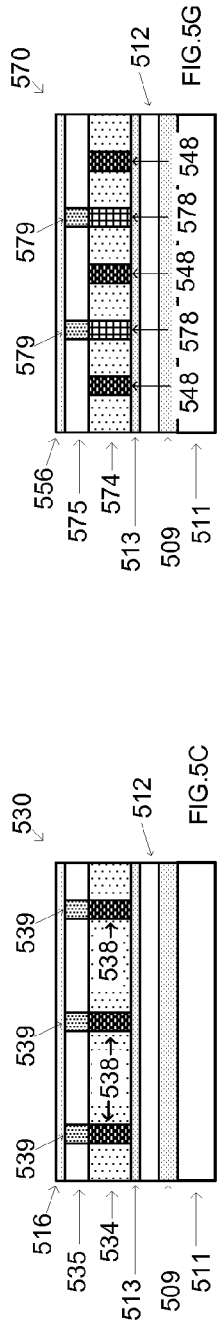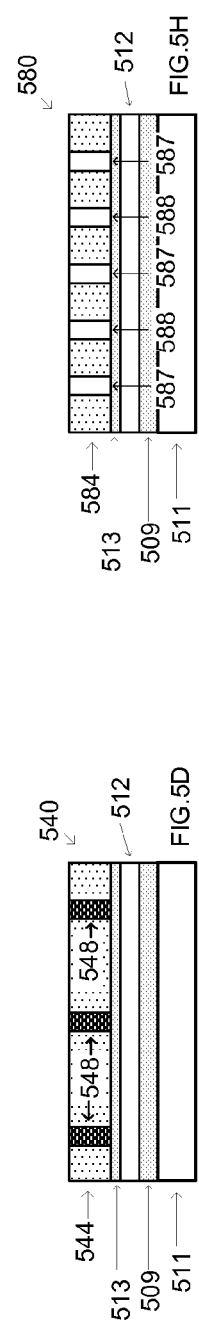

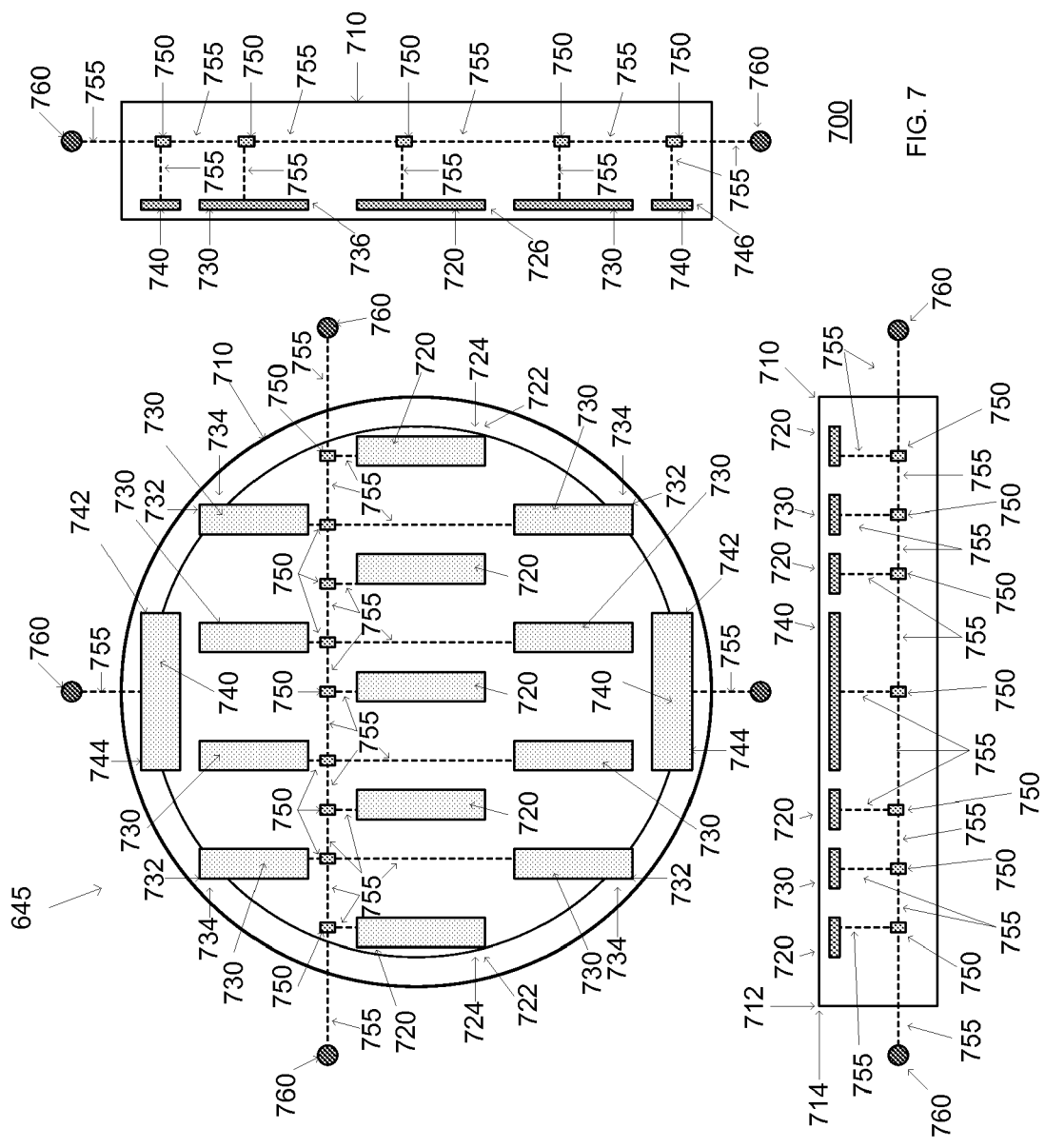

USING ELECTRIC-FIELD DIRECTED POST-EXPOSURE BAKE FOR DOUBLE-PATTERNING (D-P)

BACKGROUND OF THE INVENTION

1. Field of the Invention

The present invention relates to substrate processing, and more particularly to apparatus and methods for creating and using Electric-Field Enhancement Layers (E-FELs) in Double-Patterning (D-P) processing sequences and associated simulation and measurement models.

2. Description of the Related Art

Critical Dimension (CD) control is a critical element to sub micron deep ultra-violet (DUV) photolithography. Currently, chemically amplified resists (CARs) are the most common solution. This type of photoresist consists of an organic polymer that is coated and cross-linked prior to using the photoresist. The acid component is configured to minimize the impact of lateral diffusion. Typically, once the photoresist is coated, the photoresist is exposed in a scanner, a post exposure bake (PEB) is used to impart the selective solubility to the photoresist, and the photoresist is dissolved in an aqueous base. The CDs in the patterned photoresist can vary due to lateral acid diffusion. Continued shrinking of the semiconductor technologies has increased the need for effective control of the acid diffusion.

SUMMARY OF THE INVENTION

The invention can provide apparatus and methods of creating and using Electric-Field Enhancement Layers (E-FELs) in Double-Patterning (D-P) processing sequences and associated simulation and measurement models.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 illustrates a simplified flow diagram of a Double-Patterning (D-P) processing sequence that uses Electric-Field Enhancement Layers (E-FELs) in accordance with embodiments of the invention;

FIGS. 3A-3H illustrate a simplified representation of exemplary steps in a Double-Patterning (D-P) procedure in accordance with embodiments of the invention;

FIG. 4 illustrates a simplified flow diagram of another Double-Patterning (D-P) processing sequence that uses Electric-Field Enhancement Layers (E-FELs) in accordance with embodiments of the invention;

FIGS. 5A-5H illustrate a simplified representation of exemplary steps in another Double-Patterning (D-P) procedure in accordance with embodiments of the invention;

FIG. 7 shows a simplified block diagram of a multi-segmented electrode for an E-Field Enhanced Developing (E-FED) subsystem in accordance with embodiments of the invention.

DETAILED DESCRIPTION

There have been several attempts to use electric fields to control the diffusion of acids in chemically amplified resists, but the inventors are not aware of any successful implementations in the semiconductor industry. The inventors have developed Electric-Field Enhancement Layers (E-FELs) that they believe can be used successfully in Double-Patterning (D-P) processing sequences. In some embodiments, the E-FEL can include one or more anti-reflective coating (ARC) layers, one or more optically-activated layers, and one or more non-optically-activated enhancement layers. In various embodiments, the enhancement layer can be controlled using one or more DC (direct current) signals, one or more AC (alternating current) signals, one or more RF (radio frequency) signals, one or more microwave signals, one or more thermal radiation sources, one or more ultra-violet (UV) sources, or one or more Infra-Red (IR) sources, or any combination thereof. In other embodiments, the E-FEL can include one or more isolation layers and/or one or more optical control layers. In still other embodiments, the E-FEL can include one or more ARC layers, one or more activated-species layers, and one or more non-optically-activated layers. In alternate embodiments, the E-FEL can include one or more ARC layers, one or more delayed-activation layers, and one or more non-delayed-activation layers.

In some embodiments, the E-FELs can be configured with one or more optically-activated layers that can be exposed using an immersion scanner. During the exposure, a latent image comprising a pattern of activated regions and un-activated regions can be created in an ultra-thin Active-Species layer, and the activated regions can include one or more activated species and/or one or more charged species. After the Active-Species layer is exposed in the immersion scanner subsystem, the exposed pattern in the Active-Species layer can be transferred to the E-FEL using one or more E-Field Enhanced developing procedures performed using an E-Field Enhanced Developing (E-FED) subsystem. The E-FELs have been designed to eliminate the sidewall and scumming problems, and to minimize the number of etching steps that need to be performed during a double-patterning sequence.

Figure 1:
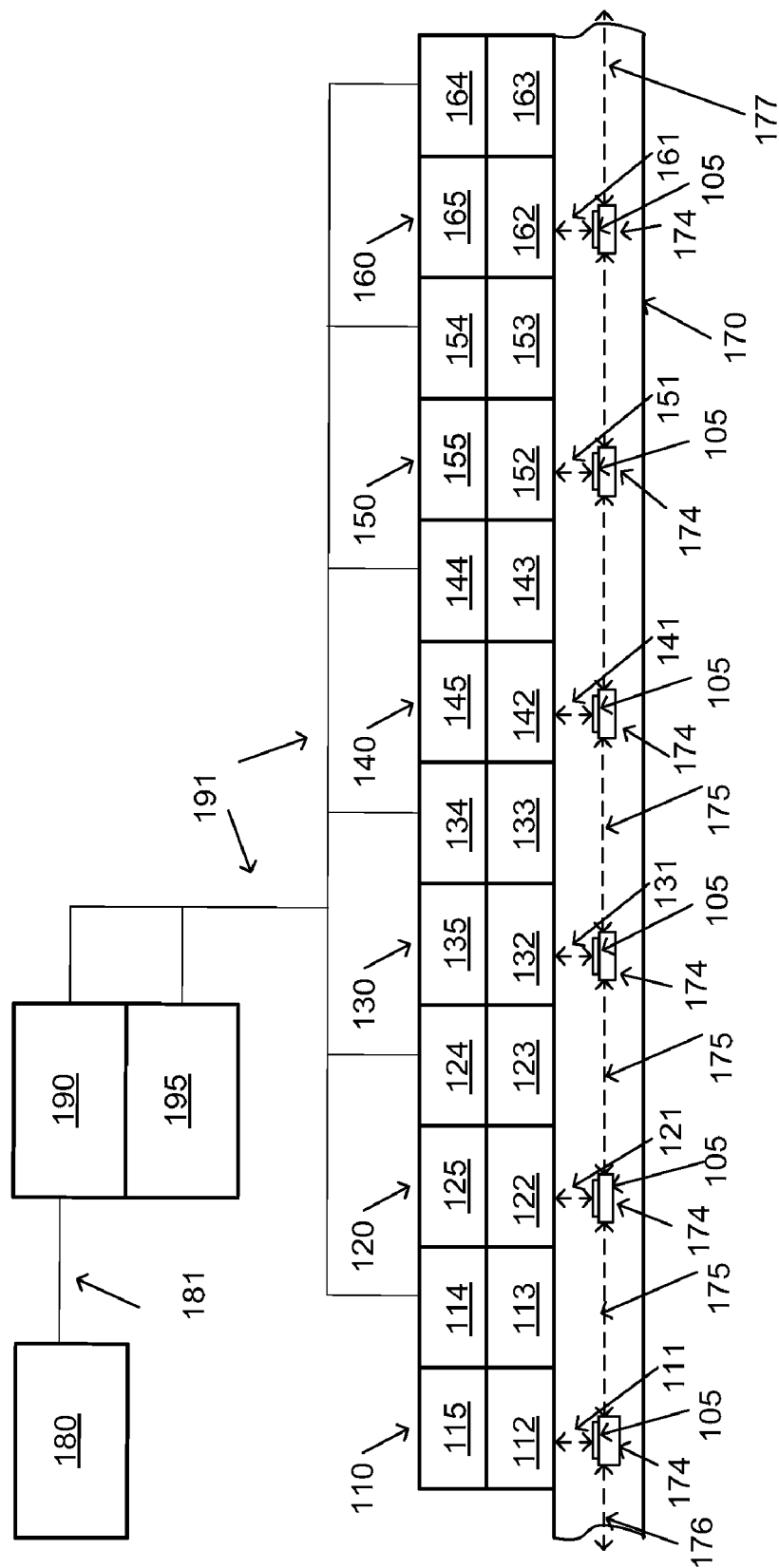
FIG. 1 shows an exemplary block diagram of a processing system in accordance with embodiments of the invention.

FIG. 1 shows an exemplary block diagram of a processing system in accordance with embodiments of the invention. The processing system 100 can be used to create semiconductor devices using Electric-Field Enhancement Layers (E-FELs). In the illustrated embodiment, processing system 100 comprises a lithography subsystem 110, a scanner subsystem 120, an etch subsystem 130, a deposition subsystem 140, an E-Field Enhanced Developing (E-FED) subsystem 150, an evaluation subsystem 160, a transfer subsystem 170, a manufacturing execution system (MES) 180, a system controller 190, and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. In addition, one or more of the subsystems (110, 120, 130, 140, 150, 160, and 170) can comprise one or more processing elements that can be used in D-P processing sequences.

The system controller 190 can be coupled to the lithography subsystem 110, the scanner subsystem 120, the etch subsystem 130, the deposition subsystem 140, the E-FED subsystem 150, the evaluation subsystem 160, and the transfer subsystem 170 using a data transfer subsystem 191. The system controller 190 can be coupled to the MES 180 using the data transfer subsystem 181. The system controller 190 can be used when E-FELs are created and/or used. Alternatively, other configurations may be used. For example, one or more of the subsystems (110, 120, 130, 140, 150, 160, and 170) can be available from Tokyo Electron Limited.

The lithography subsystem 110 can comprise one or more transfer/storage elements 112, one or more E-FEL-related processing elements 113, one or more controllers 114, and one or more E-FEL-related evaluation elements 115. One or more of the transfer/storage elements 112 can be coupled to one or more of the E-FEL-related processing elements 113 and/or to one or more of the E-FEL-related evaluation elements 115 and can be coupled 111 to the transfer subsystem 170. The transfer subsystem 170 can be coupled 111 to the lithography subsystem 110, and one or more substrates 105 can be transferred 111 between the transfer subsystem 170 and the lithography subsystem 110 in real time during E-FEL-related processing sequences. For example, the E-FEL-related processing elements 113 can perform E-FEL-related procedures, and the E-FEL-related evaluation elements 115 can provide E-FEL-related measurement data and/or inspection data. One or more of the controllers 114 can be used to exchange E-FEL-related data with one or more of the transfer/storage elements 112, with one or more of the E-FEL-related processing elements 113, and/or with one or more of the E-FEL-related evaluation elements 115.

In some embodiments, the lithography subsystem 110 can perform coating procedures, thermal procedures, measurement procedures, inspection procedures, alignment procedures, and/or storage procedures on one or more substrates during E-FEL-related processing sequences. For example, the lithography subsystem 110 can be used to deposit one or more of the E-FEL layers, can be used to transfer an active species or a charged species from one E-FEL layer to another E-FEL layer, and can be used to thermally process (bake) one or more of the masking layers. In addition, lithography subsystem 110 can be used to develop, measure, and/or inspect one or more of the E-FEL layers on one or more of the substrates. For example, the E-FEL layers can include patterned and/or un-patterned layers.

The scanner subsystem 120 can comprise one or more transfer/storage elements 122, one or more processing elements 123, one or more controllers 124, and one or more evaluation elements 125. One or more of the transfer/storage elements 122 can be coupled to one or more of the processing elements 123 and/or to one or more of the evaluation elements 125 and can be coupled 121 to the transfer subsystem 170. The transfer subsystem 170 can be coupled 121 to the scanner subsystem 120, and one or more substrates 105 can be transferred 121 between the transfer subsystem 170 and the scanner subsystem 120 in real time. For example, the transfer subsystem 170 can be coupled to one or more of the transfer/storage elements 122, to one or more of the processing elements 123, and/or to one or more of the evaluation elements 125. One or more of the controllers 124 can be coupled to one or more of the transfer/storage elements 122, to the one or more of the processing elements 123, and/or to one or more of the evaluation elements 125.

In some embodiments, the scanner subsystem 120 can be used to perform wet and/or dry exposure procedures, and in other cases, the scanner subsystem 120 can be used to perform extreme ultraviolet (EUV) exposure procedures.

The etch subsystem 130 can comprise one or more transfer/storage elements 132, one or more processing elements 133, one or more controllers 134, and one or more evaluation elements 135. One or more of the transfer/storage elements 132 can be coupled to one or more of the processing elements 133 and/or to one or more of the evaluation elements 135 and can be coupled 131 to the transfer subsystem 170. The transfer subsystem 170 can be coupled 131 to the etch subsystem 130, and one or more substrates 105 can be transferred 131 between the transfer subsystem 170 and the etch subsystem 130 in real time. For example, the transfer subsystem 170 can be coupled to one or more of the transfer/storage elements 132, to one or more of the processing elements 133, and/or to one or more of the evaluation elements 135. One or more of the controllers 134 can be coupled to one or more of the transfer/storage elements 132, to the one or more of the processing elements 133, and/or to one or more of the evaluation elements 135. For example, one or more of the processing elements 133 can be used to perform plasma or non-plasma etching, ashing, and cleaning procedures, or plasma or non-plasma etching procedures. Evaluation elements 135 can be used to measure and/or inspect one or more surfaces and/or layers of the substrates.

The deposition subsystem 140 can comprise one or more transfer/storage elements 142, one or more processing elements 143, one or more controllers 144, and one or more evaluation elements 145. One or more of the transfer/storage elements 142 can be coupled to one or more of the processing elements 143 and/or to one or more of the evaluation elements 145 and can be coupled 141 to the transfer subsystem 170. The transfer subsystem 170 can be coupled 141 to the deposition subsystem 140, and one or more substrates 105 can be transferred 141 between the transfer subsystem 170 and the deposition subsystem 140 in real time. For example, the transfer subsystem 170 can be coupled to one or more of the transfer/storage elements 142, to one or more of the processing elements 143, and/or to one or more of the evaluation elements 145. One or more of the controllers 144 can be coupled to one or more of the transfer/storage elements 142, to the one or more of the processing elements 143, and/or to one or more of the evaluation elements 145. In some embodiments, one or more of the processing elements 143 can be used to deposit one or more of the materials used in an E-FEL. In various examples, the E-FEL layers can be deposited using physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. In addition, the evaluation elements 145 can be used to measure and/or inspect one or more surfaces of the deposited E-FEL layers on one or more of the substrates.

The E-Field Enhanced Developing (E-FED) subsystem 150 can comprise one or more transfer/storage elements 152, one or more E-FED elements 153, one or more controllers 154, and one or more evaluation elements 155. Alternatively, the E-FED subsystem 150 may be configured differently. One or more of the E-FED elements 153 can be used to enhance one or more of the materials in the E-FEL. One or more of the transfer/storage elements 152 can be coupled to one or more of the E-FED elements 153 and/or to one or more of the evaluation elements 155 and can be coupled 151 to the transfer subsystem 170. The transfer subsystem 170 can be coupled 151 to the E-FED subsystem 150, and one or more substrates 105 can be transferred 151 between the transfer subsystem 170 and the E-FED subsystem 150 in real time. For example, the transfer subsystem 170 can be coupled to one or more of the transfer/storage elements 152, to one or more of the E-FED elements 153, and/or to one or more of the evaluation elements 155. One or more of the controllers 154 can be coupled to one or more of the transfer/storage elements 152, to the one or more of the E-FED elements 153, and/or to one or more of the evaluation elements 155.

The evaluation subsystem 160 can comprise one or more transfer/storage elements 162, one or more metrology elements 163, one or more controllers 164, and one or more inspection elements 165. Alternatively, the evaluation subsystem 160 may be configured differently. One or more of the transfer/storage elements 162 can be coupled to one or more of the metrology elements 163 and/or to one or more of the inspection elements 165 and can be coupled 161 to the transfer subsystem 170. The transfer subsystem 170 can be coupled 161 to the evaluation subsystem 160, and one or more substrates 105 can be transferred 161 between the transfer subsystem 170 and the evaluation subsystem 160 in real time. For example, the transfer subsystem 170 can be coupled to one or more of the transfer/storage elements 162, to one or more of the metrology elements 163, and/or to one or more of the inspection elements 165. One or more of the controllers 164 can be coupled to one or more of the transfer/storage elements 162, to the one or more of the metrology elements 163, and/or to one or more of the inspection elements 165. The evaluation subsystem 160 can comprise one or more metrology elements 163 that can be used to perform real-time optical metrology procedures that can be used to measure target structures at one or more sites on a substrate using library-based or regression-based techniques. For example, the sites on a substrate can include D-P related sites, target sites, overlay sites, alignment sites, measurement sites, verification sites, inspection sites, or damage-assessment sites, or any combination thereof. For example, one or more "golden substrates" or reference chips can be stored and used periodically to verify the performance of one or more of the metrology elements 163, and/or one or more of the inspection elements 165.

In some embodiments, the metrology elements 163 can be configured as integrated Optical Digital Profilometry (iODP) elements, and iODP elements/systems are available from Timbre Technologies Inc. (a TEL company). Alternatively, other metrology systems may be used. For example, iODP techniques can be used to obtain real-time data when E-FELs are created and/or used, the data can include critical dimension (CD) data for features in one or more of the layers in the E-FEL, and thickness data for one or more of the layers in the E-FEL, and the wavelength ranges for the iODP data can range from greater than approximately 100 nm to less than approximately 900 nm. Exemplary iODP elements can include ODP Profiler Library elements, Profiler Application Server (PAS) elements, and ODP Profiler Software elements. The ODP Profiler Library elements can comprise application specific database elements of optical spectra and its corresponding semiconductor profiles, CDs, and film thicknesses. The PAS elements can comprise at least one computer that connects with optical hardware and computer network. The PAS elements can be configured to provide the data communication, ODP library operation, measurement process, results generation, results analysis, and results output. The ODP Profiler Software elements can include the software installed on PAS elements to manage measurement recipe, ODP Profiler library elements, ODP Profiler data, ODP Profiler search/match results, ODP Profiler calculation/analysis results, data communication, and PAS interface to various metrology elements and computer network.

The metrology elements 163 can use polarizing reflectometry, spectroscopic ellipsometry, reflectometry, or other optical measurement techniques to measure accurate device profiles, accurate CDs, and multiple layer film thickness of a substrate. The integrated metrology process (iODP) can be executed as an integrated process in an integrated group of subsystems. In addition, the integrated process eliminates the need to break the substrate for performing the analyses or waiting for long periods for data from external systems. IODP techniques can be used with the existing thin film metrology systems for inline profile and CD measurement, and can be integrated with TEL processing systems and/or lithography systems to provide real-time process monitoring and control. Simulated metrology data can be generated by applying Maxwell's equations and using a numerical analysis technique to solve Maxwell's equations.

The transfer subsystem 170 can comprise transfer elements 174 coupled to transfer tracks (175, 176, and 177) that can be used to receive substrates, transfer substrates, align substrates, store substrates, and/or delay substrates. For example, the transfer elements 174 can support two or more substrates. Alternatively, other transferring means may be used. The transfer subsystem 170 can load, transfer, store, and/or unload substrates based on a E-FEL-related processing sequences, a transfer sequence, operational states, the substrate and/or processing states, the processing time, the current time, the substrate data, the number of sites on the substrate, the type of sites on the substrate, the number of required sites, the number of completed sites, the number of remaining sites, or confidence data, or any combination thereof.

In some examples, transfer subsystem 170 can use loading data to determine where and when to transfer a substrate. In other examples, a transfer system can use chamber state data to determine where and when to transfer a substrate. Alternatively, other procedures may be used. For example, when the first number of substrates is less than or equal to the first number of available processing elements, the first number of substrates can be transferred to the first number of available processing elements in the one or more of the subsystems using the transfer subsystem 170. When the first number of substrates is greater than the first number of available processing elements, some of the substrates can be stored and/or delayed using one or more of the transfer/storage elements (112, 122, 132, 142, 152, and 162) and/or the transfer subsystem 170.

In addition, the one or more subsystems (110, 120, 130, 140, 150, 160, and 170) can be used when performing E-FEL-related processing sequences that can include lithography-related procedures, scanner-related procedures, inspection-related procedures, measurement-related procedures, evaluation-related procedures, etch-related procedures, deposition-related procedures, thermal processing procedures, coating-related procedures, alignment-related procedures, polishing-related procedures, storage-related procedures, transfer procedures, cleaning-related procedures, rework-related procedures, oxidation-related procedures, nitridation-related procedures, or external processing elements, or any combination thereof.

Operational state data can be established for the subsystems (110, 120, 130, 140, 150, 160, and 170) and can be used and/or updated by E-FEL processing sequences. In addition, operational state data can be established for the transfer/storage elements (112, 122, 132, 142, 152, and 162), processing elements (113, 123, 133, 143, 153, and 163), and evaluation elements (115, 125, 135, 145, 155, and 165), and can be updated by E-FEL processing sequences. For example, the operational state data for the processing elements can include availability data, matching data for the processing elements, expected processing times for some process steps and/or sites, yield data, confidence data and/or risk data for the processing elements, or confidence data and/or risk data for one or more E-FEL-related procedures. Updated operational states can be obtained by querying in real-time one or more processing elements, and/or one or more subsystems. Updated loading data can be obtained by querying in real-time one or more transfer elements, and/or one or more transfer subsystems.

One or more of the controllers (114, 124, 134, 144, 154, and 164) can be coupled to the system controller 190 and/or to each other using a data transfer subsystem 191. Alternatively, other coupling configurations may be used. The controllers can be coupled in series and/or in parallel and can have one or more input ports and/or one or more output ports. For example, the controllers may include microprocessors having one or more core processing elements.

In addition, subsystems (110, 120, 130, 140, 150, 160, and 170) can be coupled to each other and to other devices using intranet, internet, wired, and/or wireless connections. The controllers (114, 124, 134, 144, and 190) can be coupled to external devices as required.

One or more of the controllers (114, 124, 134, 144, 154, 164, and 190) can be used when performing real-time E-FEL processing sequences. A controller can receive real-time data during an E-FEL processing sequence that can be used to update subsystem, processing element, process, recipe, profile, image, pattern, simulation, sequence data, and/or model data. One or more of the controllers (114, 124, 134, 144, 154, 164, and 190) can be used to exchange one or more Semiconductor Equipment Communications Standard (SECS) messages with the Manufacturing Execution Systems (MES) 180 or other systems (not shown), read and/or remove information, feed forward, and/or feedback the information, and/or send information as a SECS message. One or more of the formatted messages can be exchanged between controllers, and the controllers can process messages and extract new data in real-time. When new data is available, the new data can be used in real-time to update an E-FEL model and/or an E-FEL recipe currently being used for the substrate and/or lot.

In some examples, the MES 180 may be configured to monitor some subsystem and/or system processes in real-time, and factory level intervention and/or judgment rules can be used to determine which E-FEL-related procedures are monitored and which E-FEL-related data can be used. For example, factory level intervention and/or judgment rules can be used to determine how to manage the data when an error condition occurs during E-FEL processing sequences. The MES 180 can also provide modeling data, processing sequence data, and/or substrate data.

In addition, controllers (114, 124, 134, 144, 154, 164, and 190) can include memory (not shown) as required. For example, the memory (not shown) can be used for storing information and instructions to be executed by the controllers, and may be used for storing temporary variables or other intermediate information during the execution of instructions by the various computers/processors in the processing system 100. One or more of the controllers (114, 124, 134, 144, 154, 164, and 190), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL), and external subsystems and/or tools may be included. For example, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another optical metrology system. The subsystems and/or processing elements can have different interface requirements, and the controllers can be configured to satisfy these different interface requirements.

One or more of the subsystems (110, 120, 130, 140, 150, 160, and 170) can perform control applications, Graphical User Interface (GUI) applications, and/or database applications. In addition, one or more of the subsystems (110, 120, 130, 140, 150, 160, and 170) and/or controllers (114, 124, 134, 144, 154, 164, and 190) can include Design of Experiment (DOE) applications, Advanced Process Control (APC) applications, Fault Detection and Classification (FDC) applications, and/or Run-to-Run (R2R) applications.

Output data and/or messages from E-FEL processing sequences can be used in subsequent procedures to optimize the process accuracy and precision. Data can be passed in real-time during E-FEL processing sequences as real-time variable parameters, overriding current model values, and reducing DOE tables. Real-time data can be used to optimize E-FEL processing sequences.

When a regression-based library creation procedure is used that is associated with the E-FEL processing sequences, measured profile and/or signal data can be compared to simulated profile and/or signal data. The simulated data can be iteratively generated, based on sets of process-related parameters for the E-FEL processing sequences. When a library-based process is used, a metrology library can be generated and/or enhanced using E-FEL processing sequences, recipes, profiles, and/or models. For example, a metrology library can comprise simulated and/or measured metrology data and the corresponding E-FEL processing sequence data. The regression-based and/or the library-based processes can be performed in real-time. An alternative procedure for generating library data during E-FEL processing sequences can include using a machine learning system (MLS). For example, prior to generating the library data, the MLS can be trained using known input and output data, and the MLS may be trained with a subset of the library data associated with the E-FEL processing sequences.

During E-FEL processing sequences, intervention and/or judgment rules can be executed whenever a matching context is encountered. Intervention and/or judgment rules and/or limits can be established based on historical procedures, on the customer's experience, or process knowledge, or obtained from a host computer. Rules can be used in Fault Detection and Classification (FDC) procedures to determine how to respond to alarm conditions, error conditions, fault conditions, and/or warning conditions. The rule-based FDC procedures can prioritize and/or classify faults, predict system performance, predict preventative maintenance schedules, decrease maintenance downtime, and extend the service life of consumable parts in the system. Various actions can take place in response to an alarm/fault, and the actions taken on the alarm/fault can be context-based, and the context data can be specified by a rule, a system/process recipe, a chamber type, identification number, load port number, cassette number, lot number, control job ID, process job ID, slot number and/or the type of data.

Unsuccessful procedures or processing sequences can report a failure when a limit is exceeded, and successful procedures can create warning messages when limits are being approached. Pre-specified failure actions for procedures errors can be stored in a database, and can be retrieved from the database when an error occurs. For example, D-P processing sequences can reject the data at one or more of the sites for a substrate when a procedure fails.

When developing activation material, a monomer can be synthesized, and acid-labile groups can be introduced. In addition, acid-labile groups may be used to provide base solubility, to provide etch resistance, and/or to provide solubility-switching properties. Polymerization processes can be performed to control the molecular weight, to create good adhesion properties, to create good structural properties, to provide good uniformity properties, and to provide solubility-switching properties.

As used herein, the terms "resin" and "polymer" may be used interchangeably. The term "alkyl" refers to linear, branched, and cyclic alkyl. The terms "halogen" and "halo" include fluorine, chlorine, bromine, and iodine. Polymers can be used to refer to both homopolymers and copolymers and may include dimers, trimers, oligomers and the like. Monomer can be used to refer to any ethylenically or acetylenically unsaturated compound capable of being polymerized.

During some fabrication steps, ring-opening polymerization can be used. For example, an epoxide ring can be opened and the material used in one of more of the layers in the E-FEL may be bonded within the opened ring. Some activation and/or enhancement materials may include an aromatic or heterocyclic compound that can be bonded to a starting polymer as a protected group, a blocking group, or a leaving group.

In some embodiments, the materials used in the E-FEL can include chemically-activated and/or chemically-amplified materials. When chemically-amplified materials are used in an E-FEL, an acid can be generated during the activation process, and the acid can initiate a catalytic reaction that can be used to create de-blocked groups, or de-protected groups. In addition, the de-protection process can be controlled during a subsequent E-FED procedure. During the E-FED procedure, the acid can be directed through one or more of the materials in the E-FEL by the electric field producing catalyzed and un-catalyzed areas, and the acid diffusion can also produce exposed regions that can have enhanced solubility properties. For example, diffusion lengths can be at least 20 nm for chemically amplified materials being used at exposure wavelengths of 193 nm.

Chemical amplification can more effectively and more uniformly activate and distribute the de-protected materials in the E-FEL by increasing the number of chemical reactions that lead to the solubility change in the E-FEL material. In the unexposed state, an acid-labile protecting group can be used to inhibit the dissolution rate of the E-FEL materials. For example, this may be done by replacing a base-soluble hydroxyl with an insoluble group. After exposure to a light source, acid can be generated within the E-FEL material; the acid can react with acid-labile protecting group, which may be an ester or an anhydride; and a reactive hydroxyl group may be formed with or without a new protecting group. A protecting group is a group that can be used to protect a functional group from unwanted reactions. In addition, the protecting group can be removed to reveal the original functional group.

In other examples, the chemical amplification can be established by replacing one or more hydroxyl groups with acid-labile protecting groups in a polymer resin. A chemically-amplified switchable material can include: a polymer resin, a photoacid generator (PAG) to provide sensitivity to a light source having one or more wavelengths, a dissolution inhibitor to provide a solubility switch before and after exposure, and one or more components to modify the developing properties of the switchable material after exposure to a light source having one or more wavelengths. Dissolution inhibitors may be used with a switching component, and may be oligomers of an acid-labile protected monomer.

In various examples, the polymer can comprise a monomer, a copolymer, a tetrapolymer, or a pentapolymer, or a combination thereof. In addition, a blocked group, or a leaving group, or a protected group, or a cleaved group can be a dye, a chromophore, a sensitizer, an enhancer, a color mask, or a color additive, or a combination thereof. A cleaved group is a group that can be cleaved from the polymer under appropriate conditions. In addition, a de-blocked group, or a remaining group, or a de-protected group, or an activated group can be a dye, a chromophore, a sensitizer, an enhancer, a color mask, or a color additive, or a combination thereof. For example, a leaving group can be a group that can be displaced in a substitution or elimination reaction.

Sensitizer compound(s) may be used to improve the efficiency of the acid generator, establish, change, and/or improve the solubility properties of the material in one or more or the layers in the E-FEL.

A chromophore can be that part of a molecular entity consisting of an atom or group of atoms in which the electronic transition responsible for a given spectral band is approximately localized. In addition, a chromophore may be a molecule or group of atoms that can be used to establish solubility and/or optical properties by selectively absorbing or reflecting light at particular wavelengths. In various examples, the chromophore groups may include single ring and/or multiple ring aromatic groups, and the chromophores may be linked as pendant groups to a resin, and the polyester resin may comprise naphthalene groups and the polyacrylate resin comprises anthracene groups or other chromophores such as phenyl.

In some examples, the material used in one or more of the layers of the E-FEL can include silicon-containing compositions that are capable of high-resolution lithographic performance, especially in single or multilayer lithographic applications using 193 nm or shorter wavelength imaging radiation. The E-Field enhancement (EFE) material can include an acid-sensitive imaging polymer, a non-polymeric silicon additive, a radiation-sensitive acid generator, and an additive for enhancing the developing properties of the E-FEL. For example, the additive can be used to switch an E-FEL material from a non-developable state to a developable state, and the additive can be radiation-sensitive, acid-sensitive, base-sensitive, solvent-sensitive, or temperature-sensitive, or a combination thereof.

In other embodiments, the polymer used in an E-FEL layer may have little or no silicon content, and one or more non-polymeric silicon additives may be used to provide the optical properties for the E-FEL layer. For example, the polymer may contain a monomer such as a cyclic olefin, an acrylate, or a methacrylate.

FIG. 2 illustrates a simplified flow diagram of a Double-Patterning (D-P) processing sequence that uses Electric-Field Enhancement Layers (E-FELs) in accordance with embodiments of the invention.

In 205, a plurality of substrates 310 can be received by processing system (100 FIG. 1). For example, the substrates can be patterned and/or un-patterned substrates. When a substrate is received by a processing system (100 FIG. 1), the data associated with the substrate and/or lot can be received. For example, a MES 180 system can download recipes and/or process parameters to subsystems (110, 120, 130, and 140), and the recipes and/or process parameters can be used to control a substrate processing procedure. In addition, a MES can determine substrate sequencing. The downloaded data can include system recipes, process recipes, metrology recipes, EFE-related data, and D-P related data. Data can include D-P-related maps, such as historical maps, real-time maps, library-related maps, exposure maps, focus maps, dose maps, reference map(s), measurement map(s), prediction map(s), and/or confidence map(s), for an in-coming substrate and/or in-coming lot. Data can include measurement data from a measurement module associated with the processing system, a host system, and/or another processing system.

The substrates 310 can include one or more previously-created layers (311, FIG. 3A) that can include semiconductor material, low-k dielectric material, ultra-low-k dielectric material, ceramic material, glass material, metallic material, resist material, filler material, doped material, un-doped material, stressed material, oxygen-containing material, nitrogen-containing material, carbon-containing material, anti-reflective coating (ARC) material, or bottom anti-reflective coating (BARC) material, or any combination thereof. For example, the semiconductor material can include silicon (Si), Germanium (Ge), Gallium Arsenide (GaAs) material that can be stressed and/or doped.

In 210, one or more target layers (312, FIG. 3A) can be deposited on the one or more previously-created layers (311, FIG. 3A). Alternatively, one or more targets layers may already be included in the previously-created layers (311, FIG. 3A). The target layers (312, FIG. 3A) can include semiconductor material low-k dielectric material, ultra-low-k dielectric material, ceramic material, glass material, metallic material, resist material, filler material, doped material, un-doped material, stressed material, oxygen-containing material, nitrogen-containing material, carbon-containing material, anti-reflective coating (ARC) material, or bottom anti-reflective coating (BARC) material, or any combination thereof.

In 215, a first bottom anti-reflective layer (313, FIG. 3A) can be deposited on the at least one target layer (312, FIG. 3A). The first anti-reflective layer can be substantially non-reflective at a first set of wavelengths around an exposure wavelength and can be substantially reflective at a second set of wavelengths. In some embodiments, the first bottom anti-reflective layer can include a conductive polymer. In other embodiments, the bottom anti-reflective layer can be configured without a conductive polymer. In addition, the bottom anti-reflective layer (313, FIG. 3A) can include anti-reflective coating (ARC) material, and/or bottom anti-reflective coating (BARC) material.

In 220, one or more Electric Field Enhancement Layers (E-FELs) (314, FIG. 3A) can be deposited on the bottom anti-reflective layer (313, FIG. 3A). In some embodiment, the E-FEL can include a photosensitive material, optically-activated material, chemically-activated material, or electrically-activated material, temperature-activated material, or any combination thereof. In other embodiments, the E-FEL material can include anti-reflective coating (ARC) material.

In 225, a first Active-Species layer (315, FIG. 3A) can be deposited on the first un-patterned E-FEL (314, FIG. 3A). In some embodiment, the first Active-Species layer material can include a photoresist material, optically-activated material, chemically-activated material, or electrically-activated material, temperature-activated material, or any combination thereof. For example, the first Active-Species layer material can include an acid species, a base species, or an ionic species that can be optically activated during an exposure procedure. During some manufacturing procedures, an isolation layer (not shown) can be created between the first Active-Species layer (315, FIG. 3A) and the first un-patterned E-FEL (314, FIG. 3A).

In 230, a first topcoat layer (316, FIG. 3A) can be deposited on the first Active-Species layer (315, FIG. 3A). In some embodiment, the first topcoat layer material can include a conductive polymer. In other embodiments, the first topcoat layer can be configured without a conductive polymer. In addition, the first topcoat layer can be substantially transparent at a first set of wavelengths around an exposure wavelength, and can be configured as a top coat layer when immersion scanner procedures are used. Alternatively, the first topcoat layer (316, FIG. 3A) may include top anti-reflective coating (TARC) material.

In 235, a first pattern of charged species is created in the first active-species layer using first exposure procedures. One or more substrates can be transferred from the lithography subsystem (110, FIG. 1) to the scanner subsystem (120, FIG. 1) and one or more first exposed Active-Specie layers (325, FIG. 3B) can be created on the substrates using one or more scanner-related procedures. During the first exposure procedure, a plurality of first activated regions (329, FIG. 3B) can be created in the first exposed Active-Species layer (325, FIG. 3B) on the first exposed substrates (320, FIG. 3B) using the first pattern in the first mask/reticle (301, FIG. 3A). For example, a first mask/reticle (301, FIG. 3A) can be stepped and/or scanned across the substrate and multiple exposures can be performed using one or more radiation sources (302, FIG. 3A). In some embodiments, the first activated regions (329, FIG. 3B) can include one or more periodic patterns or other evaluation features (not shown) that can be used as measurement structures. In alternate embodiments, the first activated regions (329, FIG. 3B) may include one or more target patterns (not shown) that can be used for substrate alignment and/or die alignment.

In 240, a first enhancement procedure is performed to transfer a first pattern in the first active-species layer to the first EFE layer to create a single-patterned EFE layer. One or more substrates can be transferred from the scanner subsystem (120, FIG. 1) to the E-FED subsystem (150, FIG. 1) or the lithography subsystem (110, FIG. 1) and a first enhancement pattern can be created in one or more of the patterned E-FELs (334, FIG. 3C) on the E-Enhanced substrates (330, FIG. 3C) using one or more first E-Field Enhancement procedures. For example, a first pattern transfer procedure can be performed to create a first pattern of first soluble regions (338, FIG. 3C) in the patterned E-FEL (334, FIG. 3C).

In various embodiments, the previously collected measurement data, confidence data, and/or risk data from one or more substrates can be examined to determine if the first E-Field Enhancement procedure should be performed, and the number of substrates to be used for during the first E-Field Enhancement procedure. For example, one or more send-ahead substrates can be selected for processing before an entire lot is processed. Alternatively, other data may be used.

In some embodiments, an activation map can be established for the first exposed Active-Species layer (325, FIG. 3B) by the E-FED subsystem (150, FIG. 1) or the lithography subsystem (110, FIG. 1). During some E-FED procedures, one or more activation maps can be calculated and/or simulated using the active species data for the first exposed Active-Species layer (325, FIG. 3B), the exposure map data, the dose map data, the focus map data, the thickness data, or the developer data, or any combination thereof. During other E-FED procedures, the activation map can be measured using one or more sensors (650, FIG. 6) coupled to the processing chamber (610, FIG. 6) in the E-FED subsystem (600, FIG. 6). For example, optical data can be obtained from one or more surfaces of the first exposed substrates (320, FIG. 3B). The activation map can be used to identify and/or predict micro-bridging problems and non-uniform activation problems. The activation map can be used to verify the size of the activated regions and the concentration of the active species in the activated regions.

The first Active-Species layer (315, FIG. 3A) can comprise a non-amplifiable active species and the un-patterned E-FEL (314, FIG. 3A) can comprise an amplifiable charged species and polymer material. For example, the first Active-Species layer (315, FIG. 3A) can comprise one or more acid components and the un-patterned E-FEL (314, FIG. 3A) can comprise one or more polymer components. When the first Active-Species layer (315, FIG. 3A) is exposed, the acid components can remain in the first activated regions (329, FIG. 3B) until a first voltage difference (electric field) is provided across the first exposed Active-Species layer (325, FIG. 3B) and the un-patterned E-FEL (314, FIG. 3B). The time constants for the acid components can be determined by the scanner processing times, the transfer times, and the E-FED processing times.

When a non-amplifiable active species is used, the size of the first activated regions (329, FIG. 3B) can remain substantially unchanged, and the concentration of non-amplified active species can remain substantially unchanged until the first voltage difference (electric field) is applied. For example, the first voltage difference (electric field) can cause an amplified process in the E-FEL material when the E-FEL comprises an amplifiable charged species.

When an electric field is provided across the substrates (330, FIG. 3C), a first voltage difference can be established across the first exposed Active-Species layer (325, FIG. 3B) and the un-patterned E-FEL (314, FIG. 3B), and a charged species can be created at the top of the un-patterned E-FEL (314, FIG. 3B). The first voltage difference (electric field) can be used to move the charged species in a first direction through the un-patterned portion of the E-FEL material, thereby modifying one or more of the polymer components in the E-FEL material and creating the first pattern of first soluble regions (338, FIG. 3C) in the patterned E-FEL (334, FIG. 3C). For example, first voltage difference (electric field) can be used to initiate and sustain a directed solubility-changing process through the un-patterned portion of the E-FEL material. The first voltage difference can be dependent upon the materials in the first exposed Active-Species layer (325, FIG. 3B) and the un-patterned E-FEL (314, FIG. 3B). For example, the first voltage difference can range between approximately 0.0 volts and approximately 5000 volts at different times during various EFE procedures. In addition, the soluble regions can include modified and/or un-modified polymer components that are created during a directed polymer-changing (solubility-changing) process.

In some examples, the magnitude of the voltage difference (electric fields) necessary to move an active species component into the un-patterned E-FEL (314, FIG. 3B) from the first exposed Active-Species layer (325, FIG. 3B) and initiate a polymer-changing process in the un-patterned E-FEL (314, FIG. 3B) can be substantially different than the magnitude of the voltage difference (electric field) necessary to direct the polymer-changing process through the un-patterned E-FEL (314, FIG. 3B). For example, the initiating voltage difference can be larger than the sustaining voltage difference. In other examples, the initiating voltage difference can be substantially the same as the sustaining voltage difference. The required magnitudes of the voltage differences (electric fields) can be calculated using the material data for the first Active-Species layer (315, FIG. 3A), the material data for the un-patterned E-FEL (314, FIG. 3A), the exposure map data, the dose map data, the focus map data, the thickness data, or the developer data, or any combination thereof, and can be provided in the E-FEL process recipe. The magnitude of the voltage difference (electric fields) can determine the speed and direction of the charged species in the un-patterned E-FEL (314, FIG. 3B) and can determine the CDs, the SWAs, the line edge roughness (LER), and/or the line width roughness (LWR) associated with the first pattern of first soluble regions (338, FIG. 3C) in the patterned E-FEL (334, FIG. 3C).

In various examples, one or more processing gasses and/or processing fluids can be provided before, during, and/or after the polymer-changing process. In other examples, the substrate temperature can be elevated before, during, and/or after the polymer-changing process.

In some embodiments, when an activation map is established for the first exposed Active-Species layer (325, FIG. 3B), one or more E-Field (voltage difference) maps for the un-patterned E-FEL (314, FIG. 3B) can be created based on the activation map. Alternatively, a cross-linking map, a de-blocking map, and/or a de-protection map may be simulated and used. During some E-FED procedures, one or more E-Field (voltage difference) maps can be calculated and/or simulated using the material data for the first exposed Active-Species layer (325, FIG. 3B), the material data for the un-patterned E-FEL (314, FIG. 3B), the activation map data, the exposure map data, the dose map data, the focus map data, the thickness data, or the developer data, or any combination thereof. During other E-FED procedures, the E-Field (voltage difference) map can be measured using one or more sensors (650, FIG. 6) coupled to the processing chamber (610, FIG. 6) in the E-FED subsystem (600, FIG. 6). For example, field strength data and/or voltage difference data can be measured.

When the activation map identifies and/or predicts potential micro-bridging problems and/or non-uniform activation problems, the E-Field (voltage difference) map can be established and/or modified to correct these problems, and the E-Field (voltage difference) map can include different electric field strengths and/or voltage differences at different locations on the substrates. When the E-FED subsystem (600, FIG. 6) is used, the one or more sources (640, FIG. 6) that are coupled to one or more segments (646, FIG. 6) in the multi-segmented upper electrode (645, FIG. 6) can be used to establish the different electric field strengths and/or voltage differences at the different locations on the substrates. For example, the controller (655, FIG. 6) can use the activation map and/or the E-Field map to control the one or more sources (640, FIG. 6) and the voltage source (630, FIG. 6) and to establish the different electric field strengths and/or voltage differences at the different locations on the substrates at different times during various EFE procedures to correct and/or prevent these problems.

In some other embodiments, a first charged species can be used to initiate and direct a first de-blocking process through the un-patterned E-FEL (314, FIG. 3B) to create the first pattern of first soluble regions (338, FIG. 3C) in the patterned E-FEL (334, FIG. 3C), and the first soluble regions (338, FIG. 3C) can include de-blocked and/or blocked polymer material. One or more voltage differences (electric fields) can be used to enhance and/or direct the movement of the charged species during the de-blocking process in a first direction through the un-patterned E-FEL (314, FIG. 3B) and to minimize and/or prevent the de-blocking process from occurring in a second direction substantially perpendicular to the first direction. For example, the voltage differences (electric fields) can range from approximately 0.1 volts to approximately 5000 volts. In some examples, one or more processing gasses and/or processing fluids can be provided before, during, and/or after the de-blocking process. In other examples, the substrate temperature can be elevated before, during, and/or after the de-blocking process.

In still other embodiments, a first cross-linking agent can be used to initiate and direct a first cross-linking process through the un-patterned E-FEL (314, FIG. 3B) to create the first pattern of first soluble regions (338, FIG. 3C) in the patterned E-FEL (334, FIG. 3C), and the first soluble regions (338, FIG. 3C) can include cross-linked and/or non-cross-linked polymer material. One or more voltage differences (electric fields) can be used to enhance and/or direct the movement of the first cross-linking agent during the first cross-linking process in a first direction through the un-patterned E-FEL (314, FIG. 3B) and to minimize and/or prevent a cross-linking process from occurring in a second direction substantially perpendicular to the first direction. For example, the voltage differences (electric fields) can range from approximately 0.1 volts to approximately 5000 volts. In some examples, one or more processing gasses and/or processing fluids can be provided before, during, and/or after the cross-linking process. In other examples, the substrate temperature can be elevated before, during, and/or after the cross-linking process.

In some alternate embodiments, the first topcoat layer (316, FIG. 3A) or the first Active-Species layer (315, FIG. 3A) may include conductive layers that may be used to establish one or more voltage differences.

In 245, the first (previously exposed) Active-Species layer (335, FIG. 3C) and the first topcoat layer (316, FIG. 3C) can be removed from the substrates using one or more cleaning and/or stripping procedures. In some examples, one or more developing procedures can be performed before or after the cleaning and/or stripping procedures. In other examples, one or more deposition procedures can be performed after the developing, cleaning, and/or stripping procedures. The single-patterned substrates (340, FIG. 3D) can include one or more previously-created layers (311, FIG. 3D), at least one target layer (312, FIG. 3D), a bottom anti-reflective layer (313, FIG. 3D), and a single-patterned E-FEL (344, FIG. 3D) having a first pattern of first filled regions (348, FIG. 3D).

In 250, a second Active-Species layer (355, FIG. 3E) can be deposited on the single-patterned E-FEL (344, FIG. 3E). In some embodiments, the second Active-Species layer material can include a photoresist material, optically-activated material, chemically-activated material, or electrically-activated material, temperature-activated material, or any combination thereof. For example, the second Active-Species layer material can include an activatable acid species, an activatable base species, or an activatable ionic species. During some manufacturing procedures, an isolation layer (not shown) can be created between the second Active-Species layer (355, FIG. 3E) and the single-patterned E-FEL (344, FIG. 3E).

In 255, a second topcoat layer (356, FIG. 3E) can be deposited on the second Active-Species layer (355, FIG. 3E). In some embodiments, the second topcoat layer material can include a conductive polymer. In other embodiments, the second topcoat layer material can be configured without a conductive polymer. In addition, the second topcoat layer can be substantially transparent at a first set of wavelengths around an exposure wavelength. Alternatively, the second topcoat layer (356, FIG. 3E) can include top anti-reflective coating (TARC) material.

In 260, a second pattern of charged species is created in the second active-species layer using second exposure procedures. One or more substrates can be transferred from the lithography subsystem (110, FIG. 1) to the scanner subsystem (120, FIG. 1) and one or more second exposed Active-Species layer (365, FIG. 3F) can be created on the substrates using one or more scanner-related procedures. During the second exposure procedure, a plurality of second activated regions (369, FIG. 3F) can be created in the second exposed Active-Species layer (365, FIG. 3F) on the second exposed substrates (360, FIG. 3F) using the second pattern in the second mask/reticle (305, FIG. 3E). For example, a second mask/reticle (305, FIG. 3E) can be stepped and or scanned across the substrate and multiple exposures can be performed using one or more second radiation sources (306, FIG. 3E). In some embodiments, the second activated regions (369, FIG. 3F) can include one or more periodic patterns or other evaluation features (not shown) that can be used as measurement structures or used as alignment targets. In other embodiments, the first pattern of first filled regions (348, FIG. 3E) may include one or more target patterns (not shown) that can be used to align the second mask/reticle (305, FIG. 3E).

In 265, a second enhancement procedure is performed to transfer a second pattern in the second active-species layer to the first EFE layer to create a double-patterned EFE layer. One or more substrates can be transferred from the scanner subsystem (120, FIG. 1) to the E-FED subsystem (150, FIG. 1) or the lithography subsystem (110, FIG. 1) and one or more double-patterned E-FELs (374, FIG. 3G) can be created on the "doubly-enhanced" substrates (370, FIG. 3G) using one or more second EFE procedures. In some embodiments, a second pattern transfer procedure can be performed to create a second pattern of second soluble regions (378, FIG. 3G) in the double-patterned E-FEL (374, FIG. 3G).

In various embodiments, the previously collected measurement data, confidence data, and/or risk data from one or more substrates can be examined to determine if the second EFE procedure should be performed, and the number of substrates to be used for during the second EFE procedure. For example, one or more send-ahead substrates can be selected for processing before an entire lot is processed. Alternatively, other data may be used.

In some embodiments, a second activation map can be established for the second exposed Active-Species layer (365, FIG. 3F) by the E-FED subsystem (150, FIG. 1) or the lithography subsystem (110, FIG. 1). During some E-FED procedures, one or more second activation maps can be calculated and/or simulated using the second active species data for the second exposed Active-Species layer (365, FIG. 3F), the second exposure map data, the second dose map data, the second focus map data, the second thickness data, or the second developer data, or any combination thereof. During second E-FED procedures, the second activation map can be measured using one or more sensors (650, FIG. 6) coupled to the processing chamber (610, FIG. 6) in the E-FED subsystem (600, FIG. 6). For example, second optical data can be obtained from one or more surfaces of the second exposed substrates (360, FIG. 3F). The second activation map can be used to identify and/or predict micro-bridging problems and non-uniform activation problems. The second activation map can be used to verify the size of the second activated regions and the concentration of the second active species in the second activated regions.

The second Active-Species layer (355, FIG. 3E) can comprise a second non-amplifiable active species and the single-patterned E-FEL (344, FIG. 3E) can comprise a second amplifiable charged species and second polymer material.

For example, the second Active-Species layer (355, FIG. 3E) can comprise one or more second acid components and the single-patterned E-FEL (344, FIG. 3E) can comprise one or more second polymer components. When the second Active-Species layer (355, FIG. 3E) is exposed, the second acid components can remain in the second activated regions (369, FIG. 3F) until a second voltage difference (electric field) is provided across the second exposed Active-Species layer (365, FIG. 3F) and the single-patterned E-FEL (344, FIG. 3F). The time constants for the second acid components can be determined by the scanner processing times, the transfer times, and the E-FED processing times.

When a second non-amplifiable active species is used, the size of the second activated regions (369, FIG. 3F) can remain substantially unchanged, and the concentration of second non-amplified active species can remain substantially unchanged until the second voltage difference (electric field) is applied. For example, the second voltage difference (electric field) can cause an amplified process in the E-FEL material when the E-FEL comprises a second amplifiable charged species.

When a second electric field is provided across the second exposed substrates (360, FIG. 3F), a second voltage difference can be established across the second exposed Active-Species layer (365, FIG. 3F) and the single-patterned E-FEL (344, FIG. 3F), and a second charged species can be created at the top of the single-patterned E-FEL (344, FIG. 3F). The second voltage difference (electric field) can be used to move the second charged species in a first direction through the un-patterned portion of the E-FEL material in the single-patterned E-FEL (344, FIG. 3F), thereby modifying one or more of the second polymer components in the E-FEL material and creating the second pattern of second soluble regions (378, FIG. 3G) in the double-patterned E-FEL (374, FIG. 3G). For example, the second voltage difference (electric field) can be used to initiate and sustain a second directed solubility-changing process through the un-patterned portion of the E-FEL material. The second voltage difference can be dependent upon the materials in the second exposed Active-Species layer (365, FIG. 3F) and the single-patterned E-FEL (344, FIG. 3F). For example, the second voltage difference can range between approximately 0.0 volts and approximately 5000 volts at different times during various EFE procedures. In addition, the second soluble regions can include modified and/or un-modified polymer components that are created during a second directed polymer-changing (solubility-changing) process.

In some examples, the magnitude of the second voltage difference (electric fields) necessary to move a second active species component into the single-patterned E-FEL (344, FIG. 3F) from the second exposed Active-Species layer (365, FIG. 3F) and initiate a second polymer-changing process in the single-patterned E-FEL (344, FIG. 3F) can be substantially different than the magnitude of the second voltage difference (electric field) necessary to direct the second polymer-changing process through the single-patterned E-FEL (344, FIG. 3F). For example, the second initiating voltage difference can be larger than the second sustaining voltage difference. In other examples, the second initiating voltage difference can be substantially the same or less than the second sustaining voltage difference. The required magnitudes of the second voltage differences (electric fields) can be calculated using the material data for the second Active-Species layer (355, FIG. 3E), the material data for the single-patterned E-FEL (344, FIG. 3F), the exposure map data, the dose map data, the focus map data, the thickness data, or the developer data, or any combination thereof, and can be provided in the E-FEL process recipe. The magnitude of the second voltage difference (electric fields) can determine the speed and direction of the charged species in the single-patterned E-FEL (344, FIG. 3F) and can determine the CDs, the SWAs, the line edge roughness (LER), and/or the line width roughness (LWR) associated with the second pattern of second soluble regions (378, FIG. 3G) in the double-patterned E-FEL (374, FIG. 3G).

In some examples, one or more processing gasses and/or processing fluids can be provided before, during, and/or after the second polymer-changing process. In other examples, the substrate temperature can be elevated before, during, and/or after the second polymer-changing process.

In some embodiments, when a second activation map is established for the second exposed Active-Species layer (365, FIG. 3F), one or more second E-Field (voltage difference) maps for the single-patterned E-FEL (344, FIG. 3F) can be created based on the second activation map. Alternatively, a second cross-linking map, a second de-blocking map, and/or a second de-protection map may be simulated and used. During some E-FED procedures, one or more second E-Field (voltage difference) maps can be calculated and/or simulated using the material data for the second exposed Active-Species layer (365, FIG. 3F), the material data for the single-patterned E-FEL (344, FIG. 3F), the second activation map data, the second exposure map data, the second dose map data, the second focus map data, the second thickness data, or the second developer data, or any combination thereof. During second E-FED procedures, the second E-Field (voltage difference) map can be measured using one or more sensors (650, FIG. 6) coupled to the processing chamber (610, FIG. 6) in the E-FED subsystem (600, FIG. 6). For example, field strength data and/or voltage difference data can be measured.

When the second activation map identifies and/or predicts potential micro-bridging problems and/or non-uniform activation problems, the second E-Field (voltage difference) map can be established and/or modified during second E-FED procedures to correct these problems, and the E-Field (voltage difference) map can include different electric field strengths and/or voltage differences at different locations on the substrates. When the E-FED subsystem (600, FIG. 6) is used, the one or more sources (640, FIG. 6) that are coupled to one or more segments (646, FIG. 6) in the multi-segmented upper electrode (645, FIG. 6) can be used to establish the different electric field strengths and/or voltage differences at the different locations on the substrates during second E-FED procedures. For example, the controller (655, FIG. 6) can use the activation map and/or the E-Field map to control the one or more sources (640, FIG. 6) and the voltage source (630, FIG. 6) and to establish the different electric field strengths and/or voltage differences at the different locations on the substrates at different times during various EFE procedures to correct and/or prevent these problems.

In some alternate embodiments, the second topcoat layer (356, FIG. 3E) or the second Active-Species layer (355, FIG. 3E) may include conductive layers that may be used to establish one or more voltage differences.

In 270, the double-patterned EFE layer is developed. In various embodiments, one or more development procedures can be performed to create the first developed masking features (387, FIG. 3H) and the second developed masking features (388, FIG. 3H) in the developed double-patterned E-FEL (384, FIG. 3H). In addition, the second previously exposed Active-Species layer (375, FIG. 3G) and second topcoat layers (356, FIG. 3G) can be removed from the substrates using one or more cleaning and/or stripping procedures. The double-patterned substrates (380, FIG. 3H) can include a previously-created layer (311, FIG. 3H), at least one target layer (312, FIG. 3H), one or more bottom anti-reflective layers (313, FIG. 3H), and a developed double-patterned E-FEL (384, FIG. 3H) having one or more first developed masking features (387, FIG. 3H) and one or more second developed masking features (388, FIG. 3H).

In 275, evaluation data can be obtained for at least one of the one or more of the double-patterned substrates (380, FIG. 3H). The evaluation data can include risk data, confidence data, measured data, simulation data, historical data, verified data, or library data, or any combination thereof.

In 280, a query can be performed to determine if the evaluation data are within one or more first limits established for the first D-P processing sequence. When some of the evaluation data are within one or more of the first limits, procedure 200 can branch to 285. When other evaluation data are not within one or more of the first limits, procedure 200 can branch to 290.

In 285, additional substrates can be processed. For example, the processing sequence can be identified as a verified processing sequence and/or the cleaned substrates can be identified as verified substrates, when the risk data are less than risk-related limits.

In 290, one or more corrective actions can be performed. For example, the processing sequence can be identified as an unverified processing sequence and/or the cleaned substrates can be identified as unverified substrates, when the risk data are not less than risk-related limits.

In some embodiments, one or more of the double-patterned substrates (380, FIG. 3H) can be sent to the evaluation subsystem (160, FIG. 1) where measurement and/or inspection procedures can be performed. In other embodiments, one or more of the double-patterned substrates (380, FIG. 3H) can be sent to the etch subsystem (130, FIG. 1) where one or more etching procedures can be performed. For example, the developed double-patterned E-FEL (384, FIG. 3H) can be used as a masking layer to etch one or more of the anti-reflective layers (313, FIG. 3H), or one or more of the target layers (312, FIG. 3H), or one or more of the previously-created layers (311, FIG. 3H), or any combination thereof to create metal gate structures, poly-gate structures, tri-gate structures, N-FET structures, P-FET structures, FinFET structures, capacitor structures, dielectric structures, vias, and/or lines.

FIG. 3 illustrates a simplified representation of exemplary steps in a Double-Patterning (D-P) procedure in accordance with embodiments of the invention. In FIGS. (3A-3H), substrates (310-380) are shown that includes one or more previously-created layers 311, at least one target layer 312, one or more bottom anti-reflective layers 313, one or more first Electric Field Enhancement layer (E-FEL) 314, one or more first Active-Species layer 315, and one or more first topcoat layer 316.

In various examples, the previously-created layers 311 can have a thickness that can vary from approximately 10 nm to approximately 50.0 nm, the target layers 312 can have a thickness that can vary from approximately 10 nm to approximately 500.0 nm, the bottom anti-reflective layers 313 can have a thickness that can vary from approximately 2 nm to approximately 20.0 nm, the un-patterned E-FEL 314 can have a thickness that can vary from approximately 10 nm to approximately 50.0 nm the first Active-Species layer 315 can have a thickness that can vary from approximately 2 nm to approximately 20.0 nm, and a first topcoat layer 316 can have a thickness that can vary from approximately 2 nm to approximately 10.0 nm.

FIG. 3B illustrates a simplified representation of a first exposed substrate 320 that can include one or more topcoat layers 316 and one or more first activated regions 329 in one or more first exposed Active-Species layers 325. In addition, one or more previously-created layers 311, at least one target layer 312, one or more bottom anti-reflective layers 313, and at least one first un-patterned E-FEL 314 is shown.

FIG. 3C illustrates a simplified representation of an E-enhanced substrate 330 that can include one or more topcoat layers 316, one or more first activated regions 339 in the first previously exposed Active-Species layer 335, and one or more first soluble regions 338 in one or more patterned E-FELs 334.

During some EFE procedures, a uniform E-field can be provided to the entire substrate, and a first voltage difference can be established across the first exposed Active-Species layer 325 and the un-patterned E-FEL 314. The first voltage difference can be dependent upon the materials in the first exposed Active-Species layer (325, FIG. 3B) and the un-patterned E-FEL (314, FIG. 3B). The first voltage difference can be large enough to cause the active species in the first activated regions (339, FIG. 3C) in the first previously exposed Active-Species layer (335, FIG. 3C) to initiate a directed solubility-changing process in the un-patterned E-FEL (314, FIG. 3B, and create the first pattern of first soluble regions (338, FIG. 3C) in the patterned E-FEL (334, FIG. 3C). For example, the first voltage difference can range between approximately 0.0 volts and approximately 5000 volts at different times during various EFE procedures.

During some EFE procedures, a first voltage difference can be established across one or more of the first exposed Active-Species layer 325, and the one or more of the un-patterned E-FELs 314, thereby transferring the first activated regions 329 in the first exposed Active-Species layer 325 and creating a first pattern of first filled regions 348 in the patterned E-FEL 334. In some embodiments, an E-field chamber in the E-FED subsystem 150 or the lithography subsystem (110, FIG. 1) can be used to perform the EFE procedures. In addition, one or more previously-created layers 311, at least one target layer 312, and one or more bottom anti-reflective layers 313 are shown in FIG. 3C.

FIG. 3D illustrates a simplified representation of a single-patterned substrate 340 that can include one or more previously-created layers 311, at least one target layer 312, one or more bottom anti-reflective layers 313, and a single-patterned E-FEL 344 having a first pattern of first filled regions 348. In some embodiments, the first pattern of first filled regions 348 can be un-developed. In other embodiments, the first pattern of first filled regions 348 can be measured and/or inspected before the next processing steps are performed.

FIG. 3E illustrates a simplified representation of a previously processed substrate 350 that can include one or more previously-created layers 311, at least one target layer 312, one or more bottom anti-reflective layers 313, a single-patterned E-FEL 344 having a first pattern of first filled regions 348, one or more second Active-Species layers 355, and one or more second topcoat layers 356. In some embodiments, the first pattern of first filled regions 348 can be un-developed. In other embodiments, the first pattern of first filled regions 348 can be developed and filled before the next processing steps are performed.

FIG. 3F illustrates a simplified representation of a second exposed substrate 360 that can include one or more previously-created layers 311, at least one target layer 312, one or more bottom anti-reflective layers 313, a single-patterned E-FEL 344 having a first pattern of first filled regions 348, one or more second exposed Active-Species layers 365, and one or more second topcoat layers 356. In some embodiments, the second activated regions 369 can contain acidic and/or basic components that have been activated during a second exposure.

FIG. 3G illustrates a simplified representation of a "doubly-enhanced" substrate 370 that can include one or more previously-created layers 311, at least one target layer 312, one or more bottom anti-reflective layers 313, a double-patterned E-FEL 374 having a first pattern of first filled regions 348 and a second pattern of second soluble regions 378, a second previously exposed Active-Species layer 375, and one or more second topcoat layers 356. During some EFE procedures, a second voltage difference can be established across the second exposed Active-Species layer 365, and the single-patterned E-FEL 344, thereby transferring the second activated regions 369 in the second exposed Active-Species layer 365 and creating a second pattern of second soluble regions 378 in the double-patterned E-FEL 374. During other EFE procedures, a second voltage difference can be established across the second previously exposed Active-Species layer 375 and the single-patterned E-FEL 344, thereby transferring the second pattern of second activated regions 379 in the second previously exposed Active-Species layer 375 and creating substantially the same pattern of second soluble regions 378 in the double-patterned E-FEL 374. For example, the second voltage difference can range between approximately 0.0 volts and approximately 5000 volts at different times during various EFE procedures.

In some embodiments, the second pattern of second soluble regions 378 can contain de-blocked material that has been de-blocked during a second EFE procedure.

FIG. 3H illustrates a simplified representation of a double-patterned substrate 380 that can include one or more previously-created layers 311, at least one target layer 312, one or more bottom anti-reflective layers 313, and a developed double-patterned E-FEL 384 having one or more first developed masking features 387 and one or more second developed masking features 388. In some embodiments, the first developed masking features 387 and the second developed masking features 388 can be un-developed. In other embodiments, the first developed masking features 387 and the second developed masking features 388 can be developed and/or evaluated before the next processing steps are performed.

When the first Active-Species layer 315 comprises a base component, the base component can be activated during the exposure and can remain in the first activated regions 329 until an electric field is provided across the first exposed active-species layer 325 and the un-patterned E-FEL 314. In some examples, the magnitude of the electric field necessary to move the base component into the un-patterned E-FEL 314 and initiate a charged species in the un-patterned E-FEL 314 can be substantially the same as the magnitude of the electric field necessary to direct the charged species through the un-patterned E-FEL 314. In other examples, the magnitude of the electric field necessary to move the base component into the un-patterned E-FEL 314 and initiate a charged species in the un-patterned E-FEL 314 can be different than the magnitude of the electric field necessary to direct the charged species through the un-patterned E-FEL 314. The required magnitudes can be calculated using the material data for the first Active-Species layer 315, the material data for the un-patterned E-FEL 314, the base component data, the exposure map data, the dose map data, the focus map data, the thickness data, or the developer data, or any combination thereof, and can be provided in the E-FEL process recipe. The E-Field can determine the speed and direction of the charged species in the E-FEL material and can determine the CDs, the SWAs, the line edge roughness (LER), and/or the line width roughness (LWR) associated with the patterns of regions (338, 348) in the patterned E-FELs (334, 344) and the patterns of first developed masking features 387.

In addition, when the second Active-Species layer 355 comprises a base component, the base component can be activated during a second exposure and can remain in the second activated regions 369 until an electric field is provided across the second exposed Active-Species layer 365 and the single-patterned E-FEL 344. In some examples, the magnitude of the electric field necessary to move the base component into the single-patterned E-FEL 344 and initiate a charged species in the single-patterned E-FEL 344 can be substantially the same as the magnitude of the electric field necessary to direct the charged species through the single-patterned E-FEL 344. In other examples, the magnitude of the electric field necessary to move the base component into the single-patterned E-FEL 344 and initiate a charged species in the single-patterned E-FEL 344 can be different than the magnitude of the electric field necessary to direct the charged species through the single-patterned E-FEL 344. The required magnitudes can be calculated using the material data for the second Active-Species layer 355, the material data for the single-patterned E-FEL 344, the base component data, the exposure map data, the dose map data, the focus map data, the thickness data, or the developer data, or any combination thereof, and can be provided in the E-FEL process recipe. The E-Field can determine the speed and direction of the charged species in the E-FEL material and can determine the CDs, the SWAs, the line edge roughness (LER), and/or the line width roughness (LWR) associated with the patterns of regions (348, 378) in the double-patterned E-FEL 374 and the patterns of developed masking features (387, 388) in the developed double-patterned E-FEL 384. patterns of developed masking features (387, 388) in the developed double-patterned E-FEL 384.

FIG. 4 illustrates a simplified flow diagram of a Double-Patterning (D-P) processing sequence that uses Electric-Field Enhancement Layers (E-FELs) in accordance with embodiments of the invention.

In 405, a plurality of previously patterned substrates 510 can be received by processing system (100 FIG. 1). When a substrate is received by a processing system (100 FIG. 1), the data associated with the substrate and/or lot can be received. For example, a MES 180 system can download recipes and/or process parameters to subsystems (110, 120, 130, and 140), and the recipes and/or process parameters can be used to control a substrate processing procedure. In addition, a MES can determine substrate sequencing. The downloaded data can include system recipes, process recipes, metrology recipes, EFE-related data, and D-P related data. Data can include D-P-related maps, such as historical maps, real-time maps, library-related maps, exposure maps, focus maps, dose maps, reference map(s), measurement map(s), prediction map(s), and/or confidence map(s), for an in-coming substrate and/or in-coming lot. Data can include sensor data from a measurement system, a processing system, a host system, and/or external processing system.

The substrates 510 can include one or more previously-created layers (511, FIG. 5A) and one or more metal-containing layers (509, FIG. 5A). The previously-created layers (511, FIG. 5A) can include semiconductor material, low-k dielectric material, ultra-low-k dielectric material, ceramic material, glass material, metallic material, resist material, filler material, doped material, un-doped material, stressed material, oxygen-containing material, nitrogen-containing material, carbon-containing material, anti-reflective coating (ARC) material, or bottom anti-reflective coating (BARC)

material, or any combination thereof. For example, the semiconductor material can include silicon (Si), Germanium (Ge), Gallium Arsenide (GaAs) material that can be stressed and/or doped. The metal-containing layers (509, FIG. 5A) can include metallic lines, metallic contacts, metallic gate structures, or metallic array structures, or any combination thereof.

In 410, one or more target layers (512, FIG. 5A) can be deposited on the one or more previously-created layers (511, FIG. 5A). The target layers (512, FIG. 5A) can include semiconductor material low-k dielectric material, ultra-low-k dielectric material, ceramic material, glass material, metallic material, resist material, filler material, doped material, un-doped material, stressed material, oxygen-containing material, nitrogen-containing material, carbon-containing material, anti-reflective coating (ARC) material, or bottom anti-reflective coating (BARC) material, or any combination thereof.

In 415, a bottom anti-reflective layer (513, FIG. 5A) can be deposited on the at least one target layer (512, FIG. 5A). The first anti-reflective layer can be substantially non-reflective at a first set of wavelengths around an exposure wavelength and can be substantially reflective at a second set of wavelengths. In some embodiments, the first bottom anti-reflective layer can include a conductive polymer. In other embodiments, the bottom anti-reflective layer can be configured without a conductive polymer. In addition, the bottom anti-reflective layer (513, FIG. 5A) can include anti-reflective coating (ARC) material, and/or bottom anti-reflective coating (BARC) material.

In 420, one or more Electric Field Enhancement Layers (E-FELs) (514, FIG. 5A) can be deposited on the bottom anti-reflective layer (513, FIG. 5A). In some embodiment, the E-FEL can include a photosensitive material, optically-activated material, chemically-activated material, or electrically-activated material, temperature-activated material, or any combination thereof. In other embodiments, the E-FEL material can include anti-reflective coating (ARC) material.

In 425, a first Active-Species layer (515, FIG. 5A) can be deposited on the un-patterned E-FEL (514, FIG. 5A). In some embodiments, the first Active-Species layer material can include a photoresist material, optically-activated material, chemically-activated material, or electrically-activated material, temperature-activated material, or any combination thereof. For example, the first Active-Species layer material can include an acid species, a base species, or an ionic species that can be optically activated. During some manufacturing procedures, an isolation layer (not shown) can be created between the first Active-Species layer (515, FIG. 5A) and the un-patterned E-FEL (514, FIG. 5A).

In 430, a first topcoat layer (516, FIG. 5A) can be deposited on the first Active-Species layer (515, FIG. 5A). In some embodiment, the first topcoat layer material can include a conductive polymer. In other embodiments, the first topcoat layer can be configured without a conductive polymer. In addition, the first topcoat layer can be substantially transparent at a first set of wavelengths around an exposure wavelength, and can be configured as a topcoat layer when immersion scanner procedures are used. Alternatively, the first topcoat layer (516, FIG. 5A) may include top anti-reflective coating (TARC) material.

In 435, a first pattern of charged species is created in the first active-species layer using first exposure procedures. In various embodiments, one or more substrates can be transferred from the lithography subsystem (110, FIG. 1) to the scanner subsystem (120, FIG. 1) and one or more first exposed Active-Specie layers (525, FIG. 5B) can be created on the substrates using one or more scanner-related procedures. During the first exposure procedure, a plurality of first activated regions (529, FIG. 5B) can be created in the first exposed Active-Species layer (525, FIG. 5B) on the first exposed substrates (520, FIG. 5B) using the first pattern in the first mask/reticle (501, FIG. 5A). For example, a first mask/reticle (501, FIG. 5A) can be stepped and or scanned across the substrate and multiple exposures can be performed using one or more radiation sources (502, FIG. 5A). In some embodiments, the first activated regions (529, FIG. 5B) can include one or more periodic patterns or other evaluation features (not shown) that can be used as measurement structures. In alternate embodiments, the first activated regions (529, FIG. 5B) may include one or more target patterns (not shown) that can be used for substrate alignment and/or die alignment.

In 440, a first enhancement procedure is performed to transfer a first pattern in the first active-species layer to the first EFE layer to create a single-patterned EFE layer. In various embodiments, one or more substrates can be transferred from the scanner subsystem (120, FIG. 1) to the E-FED subsystem (150, FIG. 1) or the lithography subsystem (110, FIG. 1) and a first enhancement pattern can be created in one or more of the patterned E-FELs (534, FIG. 5C) on the E-Enhanced substrates (530, FIG. 5C) using one or more first E-Field Enhancement procedures. For example, a first pattern transfer procedure can be performed to create a first pattern of first soluble regions (538, FIG. 5C) in the patterned E-FEL (534, FIG. 5C).

In various embodiments, the previously collected measurement data, confidence data, and/or risk data from one or more substrates can be examined to determine if the first E-Field Enhancement procedure should be performed, and the number of substrates to be used for during the first E-Field Enhancement procedure. For example, one or more send-ahead substrates can be selected for processing before an entire lot is processed. Alternatively, other data may be used.

In some embodiments, an activation map can be established for the first exposed Active-Species layer (525, FIG. 5B) by the E-FED subsystem (150, FIG. 1) or the lithography subsystem (110, FIG. 1). During some E-FED procedures, one or more activation maps can be calculated and/or simulated using the active species data for the first exposed Active-Species layer (525, FIG. 5B), the exposure map data, the dose map data, the focus map data, the thickness data, or the developer data, or any combination thereof. During other E-FED procedures, the activation map can be measured using one or more sensors (650, FIG. 6) coupled to the processing chamber (610, FIG. 6) in the E-FED subsystem (600, FIG. 6). For example, optical data can be obtained from one or more surfaces of the exposed substrates (520, FIG. 5B). The activation map can be used to identify and/or predict micro-bridging problems and non-uniform activation problems. The activation map can be used to verify the size of the activated regions and the concentration of the active species in the activated regions.

The first Active-Species layer (515, FIG. 5A) can comprise a non-amplifiable active species and the un-patterned E-FEL (514, FIG. 5A) can comprise an amplifiable charged species and polymer material. For example, the first Active-Species layer (515, FIG. 5A) can comprise one or more acid components and the un-patterned E-FEL (514, FIG. 5A) can comprise one or more polymer components. When the first Active-Species layer (515, FIG. 5A) is exposed, the acid components can remain in the first activated regions (529, FIG. 5B) until a first voltage difference (electric field) is provided across the first exposed Active-Species layer (525, FIG. 5B) and the un-patterned E-FEL (514, FIG. 5B). The time constants for the acid components can be determined by the scanner processing times, the transfer times, and the E-FED processing times.

When a non-amplifiable active species is used, the size of the first activated regions (529, FIG. 5B) can remain substantially unchanged, and the concentration of non-amplified active species can remain substantially unchanged until the first voltage difference (electric field) is applied. For example, the first voltage difference (electric field) can cause an amplified process in the E-FEL material when the E-FEL comprises an amplifiable charged species.

When an electric field is provided across the enhanced substrates (530, FIG. 5C), a first voltage difference can be established across the first exposed Active-Species layer (525, FIG. 5B) and the un-patterned E-FEL (514, FIG. 5B), and a charged species can be created at the top of the un-patterned E-FEL (514, FIG. 5B). The first voltage difference (electric field) can be used to move the charged species in a first direction through the un-patterned portion of the E-FEL material, thereby modifying one or more of the polymer components in the E-FEL material and creating the first pattern of first soluble regions (538, FIG. 5C) in the patterned E-FEL (534, FIG. 5C). For example, first voltage difference (electric field) can be used to initiate and sustain a directed solubility-changing process through the un-patterned portion of the E-FEL material. The first voltage difference can be dependent upon the materials in the first exposed Active-Species layer (525, FIG. 5B) and the un-patterned E-FEL (514, FIG. 5B). For example, the first voltage difference can range between approximately 0.0 volts and approximately 5000 volts at different times during various EFE procedures. In addition, the soluble regions can include modified and/or un-modified polymer components that are created during a directed polymer-changing (solubility-changing) process.

In some examples, the magnitude of the voltage difference (electric fields) necessary to move an active species component into the un-patterned E-FEL (514, FIG. 5B) from the first exposed Active-Species layer (525, FIG. 5B) and initiate a polymer-changing process in the un-patterned E-FEL (514, FIG. 5B) can be substantially different than the magnitude of the voltage difference (electric field) necessary to direct the polymer-changing process through the un-patterned E-FEL (514, FIG. 5B). For example, the initiating voltage difference can be larger than the sustaining voltage difference. In other examples, the initiating voltage difference can be substantially the same as the sustaining voltage difference. The required magnitudes of the voltage differences (electric fields) can be calculated using the material data for the first Active-Species layer (515, FIG. 5A), the material data for the un-patterned E-FEL (514, FIG. 5A), the exposure map data, the dose map data, the focus map data, the thickness data, or the developer data, or any combination thereof, and can be provided in the E-FEL process recipe. The magnitude of the voltage difference (electric fields) can determine the speed and direction of the charged species in the un-patterned E-FEL (514, FIG. 5B) and can determine the CDs, the SWAs, the line edge roughness (LER), and/or the line width roughness (LWR) associated with the first pattern of first soluble regions (538, FIG. 5C) in the patterned E-FEL (534, FIG. 5C).

In some examples, one or more processing gasses and/or processing fluids can be provided before, during, and/or after the polymer-changing process. In other examples, the substrate temperature can be elevated before, during, and/or after the polymer-changing process.

In some embodiments, when an activation map is established for the first exposed Active-Species layer (525, FIG. 5B), one or more E-Field (voltage difference) maps for the un-patterned E-FEL (514, FIG. 5B) can be created based on the activation map. Alternatively, a cross-linking map, a de-blocking map, and/or a de-protection map may be simulated and used. During some E-FED procedures, one or more E-Field (voltage difference) maps can be calculated and/or simulated using the material data for the first exposed Active-Species layer (525, FIG. 5B), the material data for the un-patterned E-FEL (514, FIG. 5B), the activation map data, the exposure map data, the dose map data, the focus map data, the thickness data, or the developer data, or any combination thereof. During other E-FED procedures, the E-Field (voltage difference) map can be measured using one or more sensors (650, FIG. 6) coupled to the processing chamber (610, FIG. 6) in the E-FED subsystem (600, FIG. 6). For example, field strength data and/or voltage difference data can be measured.

When the activation map identifies and/or predicts potential micro-bridging problems and/or non-uniform activation problems, the E-Field (voltage difference) map can be established and/or modified to correct these problems, and the E-Field (voltage difference) map can include different electric field strengths and/or voltage differences at different locations on the substrates. When the E-FED subsystem (600, FIG. 6) is used, the one or more sources (640, FIG. 6) that are coupled to one or more segments (646, FIG. 6) in the multi-segmented upper electrode (645, FIG. 6) can be used to establish the different electric field strengths and/or voltage differences at the different locations on the substrates. For example, the controller (655, FIG. 6) can use the activation map and/or the E-Field map to control the one or more sources (640, FIG. 6) and the voltage source (630, FIG. 6) and to establish the different electric field strengths and/or voltage differences at the different locations on the substrates at different times during various EFE procedures to correct and/or prevent these problems.

In some other embodiments, a first charged species can be used to initiate and direct a first de-blocking process through the un-patterned E-FEL (514, FIG. 5B) to create the first pattern of first soluble regions (538, FIG. 5C) in the patterned E-FEL (534, FIG. 5C), and the first soluble regions (538, FIG. 5C) can include de-blocked and/or blocked polymer material. One or more voltage differences (electric fields) can be used to enhance and/or direct the movement of the charged species during the de-blocking process in a first direction through the un-patterned E-FEL (514, FIG. 5B) and to minimize and/or prevent the de-blocking process from occurring in a second direction substantially perpendicular to the first direction. For example, the voltage differences (electric fields) can range from approximately 0.1 volts to approximately 5000 volts. In some examples, one or more processing gasses and/or processing fluids can be provided before, during, and/or after the de-blocking process. In other examples, the substrate temperature can be elevated before, during, and/or after the de-blocking process.

In still other embodiments, a first cross-linking agent can be used to initiate and direct a first cross-linking process through the un-patterned E-FEL (514, FIG. 5B) to create the first pattern of first soluble regions (538, FIG. 5C) in the patterned E-FEL (534, FIG. 5C), and the first soluble regions (538, FIG. 5C) can include cross-linked and/or non-cross-linked polymer material. One or more voltage differences (electric fields) can be used to enhance and/or direct the movement of the first cross-linking agent during the first cross-linking process in a first direction through the un-patterned E-FEL (514, FIG. 5B) and to minimize and/or prevent a cross-linking process from occurring in a second direction substantially perpendicular to the first direction. For example, the voltage differences (electric fields) can range from approximately 0.1 volts to approximately 5000 volts. In some examples, one or more processing gasses and/or processing fluids can be provided before, during, and/or after the cross-linking process. In other examples, the substrate temperature can be elevated before, during, and/or after the cross-linking process.

In some alternate embodiments, the first topcoat layer (516, FIG. 5A) or the first Active-Species layer (515, FIG. 5A) may include conductive layers that may be used to establish one or more voltage differences.

In 445, the first previously exposed Active-Species layer (535, FIG. 5C) and the first topcoat layer (516, FIG. 5C) can be removed from the substrates using one or more cleaning and/or stripping procedures. In some examples, one or more developing procedures can be performed before or after the cleaning and/or stripping procedures. In other examples, one or more deposition procedures can be performed after the developing, cleaning, and/or stripping procedures. The single-patterned substrates (540, FIG. 5D) can include one or more previously-created layers (511, FIG. 5D), one or more metal-containing layers (509, FIG. 5D), at least one target layer (512, FIG. 5D), a bottom anti-reflective layer (513, FIG. 5D), and a single-patterned E-FEL (544, FIG. 5D) having a first pattern of first filled regions (548, FIG. 5D).

In 450, a second Active-Species layer (555, FIG. 5E) can be deposited on the single-patterned E-FEL (544, FIG. 5E). In some embodiment, the second Active-Species layer material can include a photoresist material, optically-activated material, chemically-activated material, or electrically-activated material, temperature-activated material, or any combination thereof. For example, the second Active-Species layer material can include an activatable acid species, an activatable base species, or an activatable ionic species. During some manufacturing procedures, an isolation layer (not shown) can be created between the second Active-Species layer (555, FIG. 5E) and the single-patterned E-FEL (544, FIG. 5E).

In 455, a second topcoat layer (556, FIG. 5E) can be deposited on the second Active-Species layer (555, FIG. 5E). In some embodiments, the second topcoat layer material can include a conductive polymer. In other embodiments, the second topcoat layer material can be configured without a conductive polymer. In addition, the second topcoat layer can be substantially transparent at a first set of wavelengths around an exposure wavelength. Alternatively, the second topcoat layer (556, FIG. 5E) can include top anti-reflective coating (TARC) material.

In 460, a second pattern of charged species is created in the second active-species layer using second exposure procedures. In some embodiments, one or more substrates can be transferred from the lithography subsystem (110, FIG. 1) to the scanner subsystem (120, FIG. 1) and one or more second exposed Active-Species layer (565, FIG. 5F) can be created on the substrates using one or more scanner-related procedures. During the second exposure procedure, a plurality of second activated regions (569, FIG. 5F) can be created in the second exposed Active-Species layer (565, FIG. 5F) on the second exposed substrates (560, FIG. 5F) using the second pattern in the second mask/reticle (505, FIG. 5E). For example, a second mask/reticle (505, FIG. 5) can be stepped and or scanned across the substrate and multiple exposures can be performed using one or more second radiation sources (506, FIG. 5). In some embodiments, the second activated regions (569, FIG. 5F) can include one or more periodic patterns or other evaluation features (not shown) that can be used as measurement structures or used as alignment targets. In other embodiments, the first pattern of first filled regions (548, FIG. 5E) may include one or more target patterns (not shown) that can be used to align the second mask/reticle (505, FIG. 5E).

In 465, a second enhancement procedure is performed to transfer a second pattern in the second active-species layer to the first EFE layer to create a double-patterned EFE layer. In various embodiments, one or more substrates can be transferred from the scanner subsystem (120, FIG. 1) to the E-FED subsystem (150, FIG. 1) or the lithography subsystem (110, FIG. 1) and one or more double-patterned E-FELs (574, FIG. 5G) can be created on the "doubly-enhanced" substrates (570, FIG. 5G) using one or more second EFE procedures. In some embodiments, a second pattern transfer procedure can be performed to create a second pattern of second soluble regions (578, FIG. 5G) in the double-patterned E-FEL (574, FIG. 5G).

In various embodiments, the previously collected measurement data, confidence data, and/or risk data from one or more substrates can be examined to determine if the second E-Field Enhancement procedure should be performed, and the number of substrates to be used for during the second E-Field Enhancement procedure. For example, one or more send-ahead substrates can be selected for processing before an entire lot is processed. Alternatively, other data may be used.

In some embodiments, a second activation map can be established for the second exposed Active-Species layer (565, FIG. 5F) by the E-FED subsystem (150, FIG. 1) or the lithography subsystem (110, FIG. 1). During some E-FED procedures, one or more second activation maps can be calculated and/or simulated using the second active species data for the second exposed Active-Species layer (565, FIG. 5F), the second exposure map data, the second dose map data, the second focus map data, the second thickness data, or the second developer data, or any combination thereof. During second E-FED procedures, the second activation map can be measured using one or more sensors (650, FIG. 6) coupled to the processing chamber (610, FIG. 6) in the E-FED subsystem (600, FIG. 6). For example, second optical data can be obtained from one or more surfaces of the second exposed substrates (560, FIG. 5F). The second activation map can be used to identify and/or predict micro-bridging problems and non-uniform activation problems. The second activation map can be used to verify the size of the second activated regions and the concentration of the second active species in the second activated regions.

The second Active-Species layer (555, FIG. 5E) can comprise a second non-amplifiable active species and the single-patterned E-FEL (544, FIG. 5E) can comprise a second amplifiable charged species and second polymer material. For example, the second Active-Species layer (555, FIG. 5E) can comprise one or more second acid components and the single-patterned E-FEL (544, FIG. 5E) can comprise one or more second polymer components. When the second Active-Species layer (555, FIG. 5E) is exposed, the second acid components can remain in the second activated regions (569, FIG. 5F) until a second voltage difference (electric field) is provided across the second exposed Active-Species layer (565, FIG. 5F) and the single-patterned E-FEL (544, FIG. 5F). The time constants for the second acid components can be determined by the scanner processing times, the transfer times, and the E-FED processing times.

When a second non-amplifiable active species is used, the size of the second activated regions (569, FIG. 5F) can remain substantially unchanged, and the concentration of second non-amplified active species can remain substantially unchanged until the second voltage difference (electric field) is applied. For example, the second voltage difference (electric field) can cause an amplified process in the E-FEL material when the E-FEL comprises a second amplifiable charged species.

When a second electric field is provided across the second exposed substrates (560, FIG. 5F), a second voltage difference can be established across the second exposed Active-Species layer (565, FIG. 5F) and the single-patterned E-FEL (544, FIG. 5F), and a second charged species can be created at the top of the single-patterned E-FEL (544, FIG. 5F). The second voltage difference (electric field) can be used to move the second charged species in a first direction through the un-patterned portion of the E-FEL material in the single-patterned E-FEL (544, FIG. 5F), thereby modifying one or more of the second polymer components in the E-FEL material and creating the second pattern of second soluble regions (578, FIG. 5G) in the double-patterned E-FEL (574, FIG. 5G). For example, second voltage difference (electric field) can be used to initiate and sustain a second directed solubility-changing process through the un-patterned portion of the E-FEL material. The second voltage difference can be dependent upon the materials in the second exposed Active-Species layer (565, FIG. 5F) and the single-patterned E-FEL (544, FIG. 5F). For example, the second voltage difference can range between approximately 0.0 volts and approximately 5000 volts at different times during various EFE procedures. In addition, the second soluble regions can include modified and/or un-modified polymer components that are created during a second directed polymer-changing (solubility-changing) process.

In some examples, the magnitude of the second voltage difference (electric fields) necessary to move a second active species component into the single-patterned E-FEL (544, FIG. 5F) from the second exposed Active-Species layer (565, FIG. 5F) and initiate a second polymer-changing process in the single-patterned E-FEL (544, FIG. 5F) can be substantially different than the magnitude of the second voltage difference (electric field) necessary to direct the second polymer-changing process through the single-patterned E-FEL (544, FIG. 5F). For example, the second initiating voltage difference can be larger than the second sustaining voltage difference. In other examples, the second initiating voltage difference can be substantially the same or less than the second sustaining voltage difference. The required magnitudes of the second voltage differences (electric fields) can be calculated using the material data for the second Active-Species layer (555, FIG. 5E), the material data for the single-patterned E-FEL (544, FIG. 5F), the exposure map data, the dose map data, the focus map data, the thickness data, or the developer data, or any combination thereof, and can be provided in the E-FEL process recipe. The magnitude of the second voltage difference (electric fields) can determine the speed and direction of the charged species in the single-patterned E-FEL (544, FIG. 5F) and can determine the CDs, the SWAs, the line edge roughness (LER), and/or the line width roughness (LWR) associated with the second pattern of second soluble regions (578, FIG. 5G) in the double-patterned E-FEL (574, FIG. 5G).

In some examples, one or more processing gasses and/or processing fluids can be provided before, during, and/or after the second polymer-changing process. In other examples, the substrate temperature can be elevated before, during, and/or after the second polymer-changing process.

In some embodiments, when a second activation map is established for the second exposed Active-Species layer (565, FIG. 5F), one or more second E-Field (voltage difference) maps for the single-patterned E-FEL (544, FIG. 5F) can be created based on the second activation map. Alternatively, a second cross-linking map, a second de-blocking map, and/or a second de-protection map may be simulated and used. During some E-FED procedures, one or more second E-Field (voltage difference) maps can be calculated and/or simulated using the material data for the second exposed Active-Species layer (565, FIG. 5F), the material data for the single-patterned E-FEL (544, FIG. 5F), the second activation map data, the second exposure map data, the second dose map data, the second focus map data, the second thickness data, or the second developer data, or any combination thereof. During second E-FED procedures, the second E-Field (voltage difference) map can be measured using one or more sensors (650, FIG. 6) coupled to the processing chamber (610, FIG. 6) in the E-FED subsystem (600, FIG. 6). For example, field strength data and/or voltage difference data can be measured.

When the second activation map identifies and/or predicts potential micro-bridging problems and/or non-uniform activation problems, the second E-Field (voltage difference) map can be established and/or modified during second E-FED procedures to correct these problems, and the E-Field (voltage difference) map can include different electric field strengths and/or voltage differences at different locations on the substrates. When the E-FED subsystem (600, FIG. 6) is used, the one or more sources (640, FIG. 6) that are coupled to one or more segments (646, FIG. 6) in the multi-segmented upper electrode (645, FIG. 6) can be used to establish the different electric field strengths and/or voltage differences at the different locations on the substrates during second E-FED procedures. For example, the controller (655, FIG. 6) can use the activation map and/or the E-Field map to control the one or more sources (640, FIG. 6) and the voltage source (630, FIG. 6) and to establish the different electric field strengths and/or voltage differences at the different locations on the substrates at different times during various EFE procedures to correct and/or prevent these problems.

In some alternate embodiments, the second topcoat layer (556, FIG. 5E) or the second Active-Species layer (555, FIG. 5E) may include conductive layers that may be used to establish one or more voltage differences.

In 470, one or more development procedures can be performed to create the first developed masking features (587, FIG. 5H) and the second developed masking features (588, FIG. 5H) in the developed double-patterned E-FEL (584, FIG. 5H). In addition, the second previously exposed Active-Species layer (575, FIG. 5G) and second topcoat layers (556, FIG. 5G) can be removed from the substrates using one or more cleaning and/or stripping procedures. The double-patterned substrates (580, FIG. 5H) can include a previously-created layer (511, FIG. 5H), one or more metal-containing layers (509, FIG. 5H), at least one target layer (512, FIG. 5H), one or more bottom anti-reflective layers (513, FIG. 5H), and a developed double-patterned E-FEL (584, FIG. 5H) having one or more first developed masking features (587, FIG. 5H) and one or more second developed masking features (588, FIG. 5H).

In 475, evaluation data can be obtained for at least one of the double-patterned substrates (580, FIG. 5H). The evaluation data can include risk data, confidence data, measured data, simulation data, historical data, verified data, or library data, or any combination thereof.

In 480, a query can be performed to determine if the evaluation data are within one or more first limits established for the first D-P processing sequence. When some of the evaluation data are within one or more of the first limits, procedure 400 can branch to 485. When other evaluation data are not within one or more of the first limits, procedure 400 can branch to 490.

In 485, additional substrates can be processed. For example, the processing sequence can be identified as a verified processing sequence and/or the cleaned substrates can be identified as verified substrates, when the risk data are less than risk-related limits.

In 490, one or more corrective actions can be performed. For example, the processing sequence can be identified as an unverified processing sequence and/or the cleaned substrates can be identified as unverified substrates, when the risk data are not less than risk-related limits.

In some embodiments, one or more of the double-patterned substrates (580, FIG. 5H) can be sent to the evaluation subsystem (160, FIG. 1) where measurement and/or inspection procedures can be performed. In other embodiments, one or more of the double-patterned substrates (580, FIG. 5H) can be sent to the etch subsystem (130, FIG. 1) where one or more etching procedures can be performed. For example, the developed double-patterned E-FEL (584, FIG. 5H) can be used as a masking layer to etch one or more of the bottom anti-reflective layers (513, FIG. 5H), or one or more of the target layers (512, FIG. 5H), or one or more metal-containing layers (509, FIG. 5A), or one or more of the previously-created layer (511, FIG. 5H), or any combination thereof to create metal gate structures, poly-gate structures, tri-gate structures, N-FET structures, P-FET structures, FinFET structures, capacitor structures, dielectric structures, vias, and/or lines.

In some embodiments, one or more substrates can be measured to verify that the E-FEL is being fabricated correctly and/or to verify that the semiconductor processing system is producing quality devices. When performing a measurement process, one or more structures in the E-FEL can be measured using a set of wavelengths; the measured data for one or more of the structures in the E-FEL can be compared to a product requirement; and either the substrate processing can continue if the product requirement is met, or a corrective action can be applied if the product requirement is not met.

Corrective actions can include stopping the processing, pausing the processing, re-evaluating one or more of the D-P substrates, re-measuring one or more of the D-P substrates, re-inspecting one or more of the D-P substrates, re-working one or more of the D-P substrates, storing one or more of the D-P substrates, cleaning one or more of the D-P substrates, delaying one or more of the D-P substrates, or stripping one or more of the D-P substrates, or any combination thereof. Corrective actions can also include sending error messages, removing a substrate, pausing a process, etc.

FIG. 5 illustrates a simplified representation of exemplary steps in a Double-Patterning (D-P) procedure in accordance with embodiments of the invention. In FIGS. (5A-5H), substrates (510-580) are shown that includes one or more previously-created layers 511, one or more metal-containing layers 509, at least one target layer 512, one or more bottom anti-reflective layers 513, one or more un-patterned Electric Field Enhancement (EFE) layers 514, one or more first Active-Species layer 515, and one or more first topcoat layers 516.

In various examples, the previously-created layers 511 can have a thickness that can vary from approximately 10 nm to approximately 50.0 nm; the metal-containing layer 509 can have a thickness that can vary from approximately 0.2 nm to approximately 2.0 nm. the target layers 512 can have a thickness that can vary from approximately 10 nm to approximately 500.0 nm, the bottom anti-reflective layers 513 can have a thickness that can vary from approximately 2 nm to approximately 20.0 nm, an un-patterned E-FEL 514 can have a thickness that can vary from approximately 10 nm to approximately 50.0 nm the first Active-Species layer 515 can have a thickness that can vary from approximately 2 nm to approximately 20.0 nm, and a first topcoat layer 516 can have a thickness that can vary from approximately 2 nm to approximately 10.0 nm.

FIG. 5B illustrates a simplified representation of an exposed substrate 520 that can include one or more first topcoat layers 516 and one or more first activated regions 529 in one or more first exposed Active-Specie layers (525, FIG. 5B). In addition, one or more previously-created layers 511, one or more metal-containing layers 509, at least one target layer 512, one or more bottom anti-reflective layers 513, and one or more un-patterned E-FELs 514 are shown.

FIG. 5C illustrates a simplified representation of an enhanced substrate 530 that can include one or more topcoat layers 516, one or more activated regions 539 in one or more first previously exposed Active-Species layers 535, and one or more first soluble regions 538 in one or more patterned E-FELs 534. During some EFE procedures, a first voltage difference can be established across the first exposed Active-Species layer 525 and the un-patterned E-FEL 514, thereby transferring the first activated regions 529 in the first exposed Active-Species layer 525 and creating a first pattern of first soluble regions 538 in the patterned E-FEL 534. For example, the first voltage difference can range between approximately 0.0 volts and approximately 5000 volts at different times during various EFE procedures. In some embodiments, an E-field chamber in the E-FED subsystem 150 or the lithography subsystem (110, FIG. 1) can be used to perform the EFE procedures. In addition, one or more previously-created layers 511, one or more metal-containing layers 509, at least one target layer 512, and one or more bottom anti-reflective layers 513 are shown in FIG. 5C.

FIG. 5D illustrates a simplified representation of a single-patterned substrate 540 that can include one or more previously-created layers 511, one or more metal-containing layers 509, at least one target layer 512, one or more bottom anti-reflective layers 513, and a single-patterned E-FEL 544 having a first pattern of first filled regions 548. In some embodiments, the first pattern of first filled regions 548 can be un-developed. In other embodiments, the first pattern of first filled regions 548 can be created before, during, or after a cleaning and/or stripping procedure is performed and can be filled before the next processing steps are performed.

FIG. 5E illustrates a simplified representation of a substrate 550 that can include one or more previously-created layers 511, one or more metal-containing layers 509, at least one target layer 512, one or more bottom anti-reflective layers 513, a single-patterned E-FEL 544 having a first pattern of first filled regions 548, one or more second Active-Species layers 555, and one or more second topcoat layers 556. In some embodiments, the first pattern of first filled regions 548 can be un-developed. In other embodiments, the first pattern of first filled regions 548 can be developed and filled before the next processing steps are performed.

FIG. 5F illustrates a simplified representation of a second exposed substrate 560 that can include one or more previously-created layers 511, one or more metal-containing layers 509, at least one target layer 512, one or more bottom anti-reflective layers 513, a single-patterned E-FEL 544 having a first pattern of first filled regions 548, at least one second exposed Active-Species layer 565, and one or more second topcoat layers 556. In some embodiments, the second activated regions 569 can contain acidic and/or basic components that have been activated during a second exposure.

FIG. 5G illustrates a simplified representation of a substrate 570 that can include one or more previously-created layers 511, one or more metal-containing layers 509, at least one target layer 512, one or more bottom anti-reflective layers 513, a double-patterned E-FEL 574 having a first pattern of first filled regions 548 and a second pattern of second soluble regions 578, one or more second exposed Active-Species layers 565, and one or more second topcoat layers 556. During some EFE procedures, a second voltage difference can be established across the second previously exposed Active-Species layers 575, and the single-patterned E-FEL 544, thereby transferring the second activated regions 569 in the second exposed Active-Species layers 565 and creating a second pattern of second soluble regions 578 in the double-patterned E-FEL 574. During other EFE procedures, a second voltage difference can be established across the single-patterned E-FEL 544 using the metal-containing layer 509. For example, the second voltage difference can range between approximately 0.0 volts and approximately 5000 volts at different times during various EFE procedures.

In some embodiments, the second pattern of second soluble regions 578 can contain de-blocked material that has been de-blocked during a second EFE procedure.

FIG. 5H illustrates a simplified representation of a double-patterned substrate 580 that can include one or more previously-created layers 511, one or more metal-containing layers 509, at least one target layer 512, one or more bottom anti-reflective layers 513, and a developed double-patterned E-FEL 584 having a first pattern of first developed masking features 587 and a second pattern of second developed masking features 588. In some embodiments, the first masking features 587 and the second masking features 588 can be un-developed. In other embodiments, the first developed masking features 587 and the second developed masking features 588 can be developed and/or evaluated before the next processing steps are performed.

When the first Active-Species layer 515 comprises a base component, the base component can be activated during the exposure and can remain in the first activated regions 529 until an electric field is provided across the first exposed active-species layer 525 and the un-patterned E-FEL 514. In some examples, the magnitude of the electric field necessary to move the base component into the un-patterned E-FEL 514 and initiate a charged species in the un-patterned E-FEL 514 can be substantially the same as the magnitude of the electric field necessary to direct the charged species through the un-patterned E-FEL 514. In other examples, the magnitude of the electric field necessary to move the base component into the un-patterned E-FEL 514 and initiate a charged species in the un-patterned E-FEL 514 can be different than the magnitude of the electric field necessary to direct the charged species through the un-patterned E-FEL 514. The required magnitudes can be calculated using the material data for the first Active-Species layer 515, the material data for the un-patterned E-FEL 514, the base component data, the exposure map data, the dose map data, the focus map data, the thickness data, or the developer data, or any combination thereof, and can be provided in the E-FEL process recipe. The E-Field can determine the speed and direction of the charged species in the E-FEL material and can determine the CDs, the SWAs, the line edge roughness (LER), and/or the line width roughness (LWR) associated with the patterns of regions (538, 548) in the patterned E-FELs (534, 544) and the first developed masking features 587.

In addition, when the second Active-Species layer 555 comprises a base component, the base component can be activated during a second exposure and can remain in the second activated regions 569 until an electric field is provided across the second exposed Active-Species layer 565 and the single-patterned E-FEL 544. In some examples, the magnitude of the electric field necessary to move the base component into the single-patterned E-FEL 544 and initiate a charged species in the single-patterned E-FEL 544 can be substantially the same as the magnitude of the electric field necessary to direct the charged species through the single-patterned E-FEL 544. In other examples, the magnitude of the electric field necessary to move the base component into the single-patterned E-FEL 544 and initiate a charged species in the single-patterned E-FEL 544 can be different than the magnitude of the electric field necessary to direct the charged species through the single-patterned E-FEL 544. The required magnitudes can be calculated using the material data for the second Active-Species layer 555, the material data for the single-patterned E-FEL 544, the base component data, the exposure map data, the dose map data, the focus map data, the thickness data, or the developer data, or any combination thereof, and can be provided in the E-FEL process recipe. The E-Field can determine the speed and direction of the charged species in the E-FEL material and can determine the CDs, the SWAs, the line edge roughness (LER), and/or the line width roughness (LWR) associated with the patterns of regions (548, 578) in the double-patterned E-FEL 574 and the developed masking features (587, 588) in the developed double-patterned E-FEL 584.

When the EFE material is designed to be used in a 157 nm lithographic process, the imaging polymer can contain fluorine-containing compositions and/or silicon-containing compositions. For example, using one or more fluorine-containing compounds can provide improved performance for deep ultraviolet lithography at 193 nm and 157 nm. The improved performance can be due to the high optical transparency of partially fluorinated materials and the high acidity of fluorocarbinols. For example, the EFE material can include an alkali soluble fluorinated polymer, the EFE materials, a PAG, and a cross-linking agent. The fluorinated polymers can be transparent at 193 nm and/or 157 nm, and one or more cross-linking agents can be used to attach the E-field materials when fabricating an EFE material. Exemplary cross-linking agents can include melamines, methylols, glycolurils, hydroxy alkyl amides, epoxy and epoxy amine resins, blocked isocyanates, or divinyl monomers, and exemplary enhancement materials may include colorants, non-actinic dyes, adhesion promoters, coating aids, speed enhancers, or surfactants, or combinations thereof. In addition, when 157 nm lithographic process, one or more topcoat layers can be used that are compatible with the 157 nm lithographic process.

In some embodiments, 193 nm UV radiation may be used, and the total exposure energy may be less than or equal to approximately 100 millijoules/cm2.

In still other examples, the E-FEL material can comprise a polymer, an acid generator compound, and a solubility-switching material that can be coupled to the polymer as a leaving group, and a second set of solubility properties can be established after the leaving group is removed. Alternatively, the solubility-switching material may be coupled to the polymer differently, and the second set of solubility properties may be established after the solubility-switching material is removed, activated, de-protected, and/or de-blocked.

In various examples, the acid generator can be photoactive in one layer and non-photoactive in another layer.

When the E-FEL material is produced, sidewall-enhancing components and/or improved solvents can be used to provide improved structures with substantially small amounts of LER and/or LWR.

Figure 6:
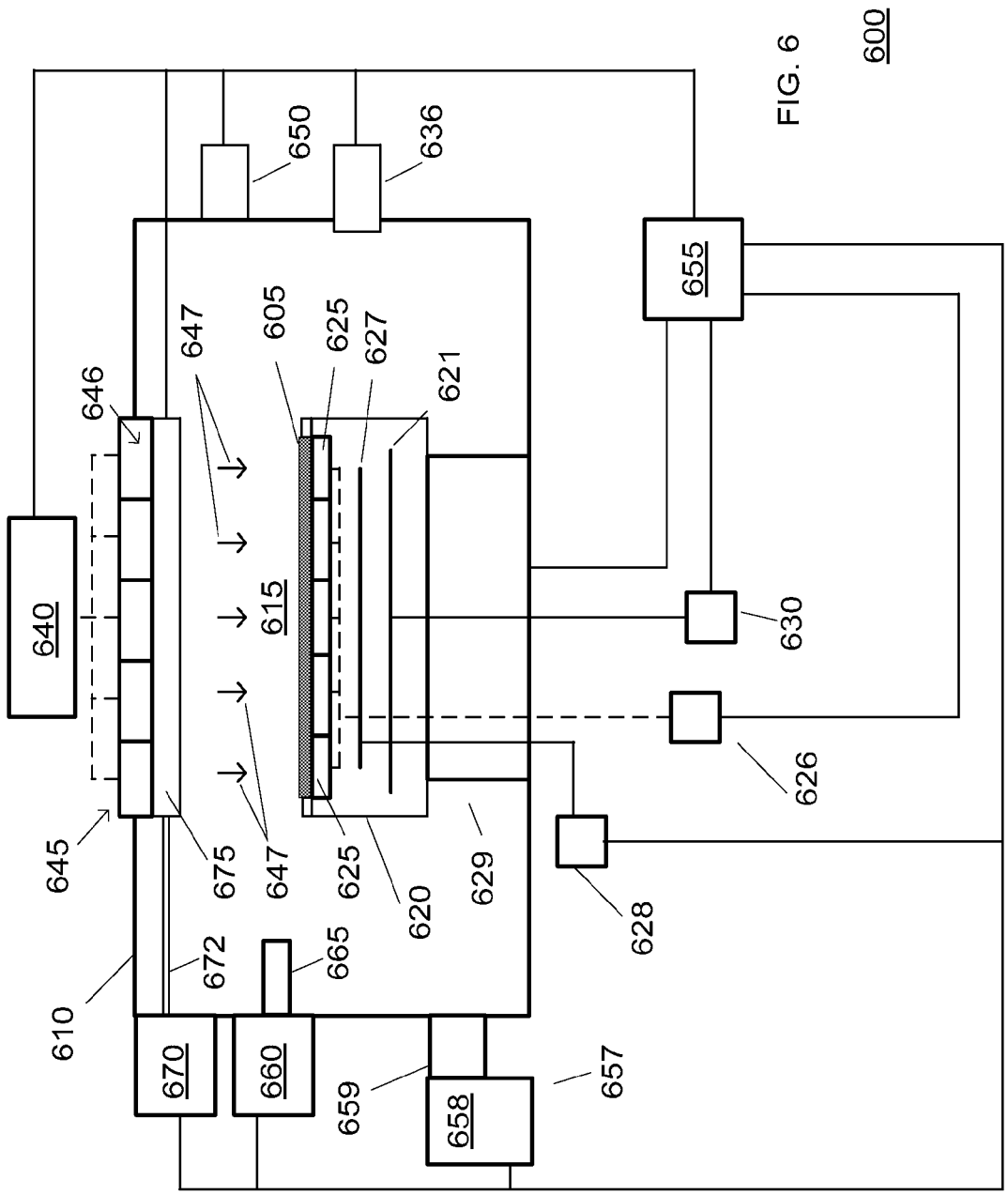
FIG. 6 shows an exemplary block diagram of an E-Field Enhanced Developing (E-FED) subsystem in accordance with embodiments of the invention.

FIG. 6 shows an exemplary block diagram of an E-Field Enhanced Developing (E-FED) subsystem in accordance with embodiments of the invention. An exemplary E-FED subsystem 600 is shown in FIG. 6, and the illustrated E-FED subsystem 600 can include a processing chamber 610, substrate holder 620, upon which a substrate 605 to be processed is affixed, and vacuum pumping system 657. For example, substrate holder 620 can be coupled to and insulated from the processing chamber 610 using base 629. Substrate 605 can be, for example, a semiconductor substrate, a work piece, or a liquid crystal display (LCD).

In some embodiments, a fluid supply system 660 can be coupled to the processing chamber 610 and a dispensing system 665 that can be configured to provide one or more process fluids to the surface of substrate 605. Alternatively, process fluids may not be required or may be provided differently. In addition, a gas supply system 670 can be coupled to the processing chamber 610 and to a flow control system 672 that can be configured to provide one or more process gasses to the gas injection system 675. A gas or mixture of gases can be introduced via gas injection system 675 to the process space 615, and the chamber pressure can be adjusted. Desirably, the process gas is utilized to create materials specific to a predetermined material process, and to aid either the deposition of material to substrate 605 or the removal of material from the exposed surfaces of substrate 605 during development procedures. For example, controller 655 can be used to control vacuum pumping system 657, fluid supply system 660, and gas supply system 670.

Substrate 605 can be, for example, transferred into and out of the processing chamber 610 through a slot valve and chamber feed-through assembly 636 via robotic transfer system (not shown) where it is received by substrate lift pins (not shown) housed within substrate holder 620 and mechanically translated by devices housed therein. After the substrate 605 is received from transfer system, it can be lowered to an upper surface of substrate holder 620. In some examples, substrate 605 can be affixed to the substrate holder 620 via a clamping system (not shown). Furthermore, substrate holder 620 can further include a multi-zone heater assembly 627 that can be coupled to a temperature control system 628. In some examples, one or more temperature control elements 625 can receive backside gas from a backside gas supply system 626 can be used to improve the gas-gap thermal conductance between substrate 605 and substrate holder 620. The multi-zone heater assembly 627 can include resistive heating elements, and/or thermoelectric heaters/coolers.

In some embodiments, the E-FED subsystem 600 can include one or more sources 640 that can be coupled to one or more segments 646 in a multi-segmented upper electrode 645. The substrate holder 620 and the multi-segmented upper electrode 645 can be used to establish one or more electric fields across the substrate 605. Each segment 646 in the multi-segmented upper electrode 645 can be independently controlled to provide a uniform or non-uniform electric field 647 during one or more E-FED procedures. In one embodiment, the electric field strength can be controlled to cause a directed solubility change to take place in one or more E-FELs on the substrate 605.

In other embodiments, the multi-segmented upper electrode 645 can be configured and operated as a plurality of E-beam sources that can be used to direct one or more electric fields 647 to the substrate 605. The electric field intensity provided by each E-beam source can be independently controlled during one or more E-FED procedures. In one embodiment, the electric field intensity can be controlled to cause a directed solubility change to take place in one or more E-FELs on the substrate 605.

In some E-FED subsystem configurations, the substrate holder 620 can include a lower electrode 621 that can be coupled to a voltage source 630. A DC voltage can be established on the lower electrode 621 during an E-FED procedure. Alternatively, the voltage source 630 may be a low frequency (AC) source, an RF source, or a microwave source. In other configurations, the lower electrode 621, the voltage source 630, and/or the filter network may not be required. In still other configurations, the signals may be applied to the lower electrode 621 at multiple frequencies.

In some configurations, vacuum pumping system 657 can include a vacuum pump 658 and a gate valve 659 for controlling the chamber pressure. Furthermore, a device for monitoring chamber pressure (not shown) may be coupled to the processing chamber 610. In addition, the pressure in the FED chamber can be controlled between approximately 5 mTorr and approximately 400 mTorr during the E-FED procedure.

During some E-FED procedures, an edge temperature and a center temperature can be established for the substrate using the multi-zone heater assembly 627. The edge temperature and a center temperature can vary between approximately 10 degrees Celsius and approximately 70 degrees Celsius during an E-FED procedure. In addition, the processing time for the E-FED procedure can vary from approximately 30 seconds to approximately 6 minutes.

As depicted in FIG. 6, E-FED subsystem 600 can include one or more sensors 650 coupled to processing chamber 610 to obtain performance data, and controller 655 can be coupled to the sensors 650 to receive performance data. The sensors 650 can include both sensors that are intrinsic to the processing chamber 610 and sensors extrinsic to the processing chamber 610. The sensors 650 can include an Optical Emissions Spectroscopy (OES) sensor that can be used as an End Point Detector (EPD) and can provide EPD data.

Controller 655 can include a microprocessor, memory, and a digital I/O port (potentially including D/A and/or A/D converters) capable of generating control voltages sufficient to communicate and activate inputs to the E-FED subsystem 600 as well as monitor outputs from E-FED subsystem 600. As shown in FIG. 6, controller 655 can be coupled to and exchange information with the substrate holder 620, voltage source 630, multi-segmented upper electrode 645, vacuum pumping system 657, backside gas delivery system 626, temperature control system 628, and sensors 650. A program stored in the memory is utilized to interact with the aforementioned components of the E-FED subsystem 600 according to a stored process recipe.

When an E-FEL is created, the E-FEL material can include a non-optically-sensitive polymer that can include a blocking component. In other embodiments, the E-FEL can include an optically-sensitive polymer that can include a blocking component. In some examples, the E-FEL can include an acid-sensitive polymer that can be de-protected by an acidic component, and the movement of the acid component can be directed and enhanced using one or more E-fields having different strengths and/or different frequencies. In other examples, the E-FEL can include a base-sensitive polymer that can be de-protected by a base component, and the movement of base component can be directed and enhanced using one or more E-fields having different strengths and/or different frequencies. In some other examples, the E-FEL can include a radiation-sensitive polymer that can be de-protected by exposure to a radiation source, and the movement of the de-protection species can be directed and enhanced using one or more E-fields having different strengths and/or different frequencies. In still other examples, the bottom masking layer can include a thermally-sensitive polymer that can be de-protected by thermal radiation, and the movement of the de-protection species can be directed and enhanced using one or more E-fields having different strengths and/or different frequencies.

An activation layer can be deposited on top of the E-FEL. In some embodiment, the activation layer can include an optically-sensitive polymer that can include a non-chemically-amplified component. In other embodiments, the activation layer can include an optically-sensitive polymer that can include a chemically-amplified component. In some examples, the activation layer can include an acid-generating polymer that can be de-protected by exposure to an optical source. In other examples, the activation layer can include a base-generating polymer that can be de-protected by an optical source. In some other examples, the activation layer can include a radiation-sensitive polymer that can be activated by exposure to a radiation source. In still other examples, the activation layer can include a thermally-sensitive polymer that can be activated by thermal radiation. In some embodiments, an isolation layer can be deposited between the activation layer and the bottom masking layer.

In addition, when some E-FELs are designed for use with immersion lithography processes, out-gassing from the material used in the E-FEL and/or out-gassing from the material used in the other layers can potentially contaminate the exposure lens. Out-gassing can cause transmission loss and distorted images. In some embodiments, a thin cap layer may be required on top of the E-FEL stack to eliminate the contamination issue. When topcoats are used with E-FELs, the topcoats should be soluble in TMAH developers but be insoluble in the immersion fluid. In addition, the topcoat material should be highly transparent at 193 nm, and be compatible with the materials in the E-FEL and the immersion fluid.

FIG. 7 illustrates a simplified block diagram of another multi-segmented electrode in accordance with embodiments of the invention. In the illustrated embodiment, a multi-segmented electrode 700 is shown that includes a mounting assembly 710 having a thickness 712 and a diameter 714. The thickness 712 can vary from approximately 0.05 cm to approximately 1.0 cm, and diameter 714 can vary from approximately 250 mm to approximately 500 mm. The diameter 714 can be dependent upon the size of the substrate being processed. A plurality of inner segments 720, a plurality of middle segments 730, and a plurality of outer segments 740 can be configured in the mounting assembly 710. The width 722 of the inner segments 720 can vary from approximately 5 mm to approximately 40 mm, the length 724 of the inner segments 720 can vary from approximately 10 mm to approximately 100 mm, and the thickness 726 of the inner segments 720 can vary from approximately 1 mm to approximately 5 mm. The width 732 of the middle segments 730 can vary from approximately 5 mm to approximately 40 mm, the length 734 of the middle segments 730 can vary from approximately 10 mm to approximately 100 mm, and the thickness 736 of the middle segments 730 can vary from approximately 1 mm to approximately 5 mm. The width 742 of the outer segments 740 can vary from approximately 5 mm to approximately 40 mm, the length 744 of the outer segments 740 can vary from approximately 10 mm to approximately 100 mm, and the thickness 746 of the outer segments 740 can vary from approximately 1 mm to approximately 5 mm. Alternatively, a different number of segments and different configurations may be used.

A plurality of input/outer elements 760 and a plurality control elements 750 are shown that can be configured to provide input signals, to provide input power, and/or to receive output signals. A plurality control elements 750 are also shown that can be configured to receive input signals, to control input power, and/or to create output signals. In addition, a plurality signal/supply busses 755 are shown that are coupled to the input/outer elements 760, coupled to the plurality control elements 750, coupled to the inner segments 720, couple to the middle segments 730, and coupled to the outer segments 740. The signal/supply busses 755 can be configured for DC signals, AC signals, digital signals, RF signals, microwave signals, and/or control signals.

In other embodiments, the chemically amplified material can include: a polymer resin, a non-photoacid generator (NPAG) to provide sensitivity to a non-optical activation source, a dissolution inhibitor to provide a solubility switch before and after exposure, and one or more components to enhance the developing properties of the EFE material after exposure to a light source having one or more wavelengths. Dissolution inhibitors may be used with an EFE component, and may be oligomers of an acid-labile protected monomer. For example, non-optical activation sources can include chemical activators, electrical activators, thermal activators, and/or pressure activators.

In some embodiments, when a first layer in an E-FEL is in a first developing state, the first layer can not be developed using an aqueous solution of tetramethylammonium hydroxide (TMAH), and when the first layer is in a second developing state, the first layer can be developed using an aqueous solution of 0.26 N tetramethylammonium hydroxide (TMAH). The developing rate can be dependent on the chemical reactions between the basic developer solution and the acid in the polymer chains. This chemical reaction can be modeled as a reaction-limited process, and the modeling inputs can include the structure of the polymer, and the structure of the EFE material.

In some examples, the E-FEL material can comprise a basic additive, a dissolution inhibitor, an anti-striation agent, a plasticizer, a speed enhancer, filler, or a wetting agent, or a combination thereof.

When fabricating an E-FEL, tradeoffs between using organic and inorganic materials can be examined. The optical absorption, feature CD profile, CD uniformity, line edge and sidewall roughness, and line feature slimming under Scanning Electron Microscope (SEM) inspection and analysis properties can be analyzed when fabricating an E-FEL.

In addition, E-FEL material and/or ARC material can be incorporated into spin-on materials, such as spin-on glass (SOG) material. Exemplary spin-on-glass materials may include methylsiloxane, methylsilsesquioxane, phenylsiloxane, phenylsilsesquioxane, methylphenylsiloxane, methylphenylsilsesquioxane, and silicate polymers, and the spin-on-glass compositions can be dissolved in appropriate solvents to form coating solutions and can be applied to various layers of materials during the fabrication of semiconductor devices.

In various embodiments, the EFE materials can be activated during different processing steps, and the EFE behavior can be simulated by developing a lattice-type model that approximates the configuration of the E-FEL during and/or after the E-FED procedure. In addition, the effects of solvent evaporation and film shrinkage during the process can also be modeled. Some commercially available software packages may be used to model and/or simulate the dissolution and the optical properties of the EFE materials. The modeling and/or simulating can be performed using different imaging sources, different EFE materials, different masks, and different layer configurations. In addition, the modeling and/or simulating can be performed over wide and/or narrow wavelength ranges, and transforms may be used to improve accuracy and/or lessen the computational time. The modeling and/or simulating can be performed in real-time and prediction models and maps can be developed for the different EFE materials. In addition, modeling and/or simulating can be performed in real-time and thermal models and maps can be developed for the different switching materials. The enhancing properties may be controlled and/or optimized by using a fixed or variable development time and/or a fixed or variable thermal processing time. These times may depend on the time required to complete the de-protection and/or activation of the EFE material. When de-protection and/or activation occur, the dissolution properties of the E-FEL change.

In some embodiments, the enhancement layers of the E-FEL can be developed using an aqueous solution of 0.26 N tetramethylammonium hydroxide (TMAH), and the dissolution of the exposed switching material can be dependent on the chemical reactions between the basic developer solution and the acid in the polymer chains. This chemical reaction can be modeled as a reaction-limited process, and the modeling inputs can include the structure of the polymer, and the structure of the switching material.

The optical properties of the E-FEL can also be important at other wavelengths when an exposed or developed E-FEL is being measured using optical metrology techniques. The imaging component of the E-FEL is not limited to the use of any specific imaging polymer. In some embodiments, the imaging polymer can be an acid-sensitive polymer having acid-labile pendant groups that can be cleaved in the presence of acid generated during exposure. Alternatively, cleaving may occur during a thermal processing step.

Exemplary acid-labile protecting components may include tertiary alkyl (or cycloalkyl) esters (e.g., t-butyl, methyl cyclopentyl, methyl cyclohexyl, and methyl adamantyl), ketals, and acetals.

In some embodiments, the E-FEL material may contain a non-polymeric silicon additive, and the non-polymeric silicon additive may contain acid-labile groups. Exemplary non-polymeric silicon additives may include: Tris(trimethylsilylmethyl) 1,3,5-cyclohexanetricarboxylate (TMSCT), Bis(trimethylsilylmethyl) 1,4-cyclohexanedicarboxylate (TMSCD), Bis(bis(trimethylsilyl)methyl) 1,4-cyclohexanedicarboxylate (BTSCD), Bis(tris(trimethylsiloxysilyl)methyl) 1,4-cyclohexanedicarboxylate (BSOSCD), Tris(trimethylsiloxysilyl)methyl 1-adamantanecarboxylate (SOSAC), 2,5-Bis(trimethylsilylmethyl-carboxyloxy)-2,5-dimethylhexane (BTSDMH), or lactone-containing non-polymeric silicon additives.

The E-FEL material may also include one or more radiation-sensitive acid generators. Exemplary radiation-sensitive acid generators may include modified onium salts such as triaryl sulfonium or diaryliodonium hexafluoroantimonate, hexafluoroarsenates, triflates, perfluoroalkane sulfonates (e.g., perfluoromethane sulfonate, perfluorobutane, perfluorohexane sulfonate, perfluorooctane sulfonate, etc.), perfluoroalkyl sulfonyl imide, perfluoroalkyl sulfonyl methide, perfluoroaryl sulfonyl imide, perfluoroaryl sulfonyl methide; substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), .alpha.-.alpha.'bis-sulfonyl diazomethanes, naphthoquinone-4-diazides, alkyl disulfones or others.

Exemplary acid generators for the 193 nm exposure wavelength may include onium salts and sulfonate esters of hydroxyimides, such as diphenyl iodonium salts, triphenyl sulfonium salts, dialkyl iodonium salts, or trialkylsulfonium salts. Exemplary acid generators for the 248 nm exposure wavelength may include onium salts, such as diphenyl iodonium salts, triphenyl sulfonium salts or sulfonate esters of hydroxyimides. Additional exemplary ionic PAGs may include diazonium salts, iodonium salts, sulfonium salts, or non-ionic PAGs may include diazosulfonyl compounds, sulfonyloxy imides, or nitrobenzyl sulfonate esters, although any photosensitive compound that produces an acid upon irradiation may be used. Other compounds that form an acid upon irradiation that may be used are triazines, oxazoles, oxadiazoles, thiazoles, or substituted 2-pyrones. Mixtures of PAGs may be used, and mixtures of ionic and nonionic PAGs may also be used.

In many examples, the E-FEL material can include base additives that can be used to control the diffusion process and improve the image. Alternatively, a basic additive may be used as a switching material and may be used to change the dissolution properties of the E-FEL. Exemplary bases can include amines, ammonium hydroxide, or photosensitive bases. In addition, base additives may include aliphatic or alicyclic tertiary alkyl amines or t-alkyl ammonium hydroxides such as t-butyl ammonium hydroxide (TBAH). Other exemplary bases may include tetrabutylammonium lactate, or a hindered amine. The base additive can be used in relatively small amounts, e.g. about 0.03 to 5 percent by weight relative to the total solids.

In some embodiments, an E-FEL may be applied directly over a planarization material that has already been deposited on a substrate, or in other embodiments, an E-FEL may include a planarization material. For example, the planarization material may include styrene, adamantyl acrylate, and/or glycidyl acrylate.

When reflectance values are used to characterize an E-FEL, the E-FEL can have switchable reflectance values. A first set of reflectance values can be established before exposure, and a second set of reflectance values can be established after exposure. Reflectance values can be wavelength dependent. For example, a reflectance value can be determined using a ratio that includes the intensity of light entering the film and the intensity of light exiting the film. Anti-reflecting films can have reflectance values that can be less than ten percent at wavelengths other than an exposure wavelength.

When (n and k) values are used to characterize an E-FEL, the E-FEL can have switchable sets of (n and k) values. One set of (n and k) values can be established before exposure and another set of (n and k) values can be established after exposure.

When one or more BARC/ARC films are required in a E-FEL, they can be deposited separately and can have different exposure procedures associated with them. One or more of the BARC/ARC films may be subsequently patterned and/or used as an etch hard mask. In addition, a layer of purified HEXAMETHYLDISILAZANE (HMDS) can be deposited before the BARC layer is deposited, and/or before the E-FEL is deposited.

Silicon-containing materials may be used when fabricating an E-FEL material since the n and k values may be determined by controlling the silicon content of a silicon-containing film, such as a SiON or $SiO_x$ film. For example, when an E-FEL includes multiple films, two silicon-containing films can be used that have compatible (matching) optical properties, such as (n) and (k), that can be selected to provide a minimum amount of reflection (i.e., less than 1%) within a wavelength range around the exposure wavelength. In addition, one or more silicon-containing films may be patterned and/or used as an etch hard mask. When an E-FEL includes multiple films, the thicknesses, the extinction coefficients and/or the index of refractions can be controlled and/or matched to minimize reflectivity before and during exposure, and the reflectivity can be increased by changing one or more extinction coefficients and/or one or more indices of refraction after exposure.

Non-aromatic polymers may used in some cases since they can be substantially opaque at about 193 nm. Furthermore, at lower wavelengths, the reflection component becomes more important, and at the lower wavelengths, antireflective coatings can be used.

Exemplary dyes may include monomers or polymers of triphenylphenol, 2-hydroxyfluorene, 9-anthracenemethanol, 2-methylphenanthrene, 2-naphthalene ethanol, 2-naphthyl-beta-d-galactopyranoside hydride, hydroxystyrene, styrene, acetoxystyrene, benzyl methacrylate, N-methyl maleimide, vinyl benzoate, vinyl 4-tert-butylbenzoate, ethylene glycol phenyl ether acrylate, phenoxypropyl acrylate, benzyl mevalonic lactone ester of maleic acid, 2-hydroxy-3-phenoxypropyl acrylate, phenyl methacrylate, benzyl methacrylate, 9-anthracenylmethyl methacrylate, 9-vinylanthracene, 2-vinylnaphthalene, N-vinylphthalimide, N-(3-hydroxy) phenyl methacrylamide, N-(3-hydroxy-4-hydroxycarbonylphenylazo)phenyl methacrylamide, N-(3-hydroxyl-4-ethoxycarbonylphenylazo)phenyl methacrylamide, N-(2,4-dinitrophenylaminophenyl)maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, or tetrahydroammonium sulfate salt of 3-(4-sulfophenyl)azoacetoacetoxy ethyl methacrylate.

The components of the switchable materials and/or E-FELs can be deposited using known procedures. For example, spraying, spinning, dipping, roller coating, or other conventional deposition techniques may be used. One or more of the E-FEL materials may be dissolvable in a solvent, and the solvent and/or residues can be eliminated in a drying step. Exemplary solvents may include propylene glycol mono-alkyl ether, propylene glycol alkyl (e.g. methyl) ether acetate, 2-heptanone, 3-methoxy-3-methyl butanol, butyl acetate, anisole, xylene, diglyme, ethylene glycol monoethyl ether acetate, ethylene glycol monomethyl ether, ethylene glycol monoethyl ether, diethylene glycol monoethyl ether, ethylene glycol monoethyl ether acetate, ethylene glycol monomethyl acetate, methyl ethyl ketone, or a monooxymonocarboxylic acid ester, such as methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, ethoxy ethyl propionate, methyl 3-oxypropionate, ethyl 3-oxypropionate, methyl 3-methoxypropionate, ethyl 3-methoxypropionate, methyl 2-oxypropionate, ethyl 2-oxypropionate, ethyl 2-hydroxypropionate (ethyl lactate), ethyl 3-hydroxypropionate, propyl 2-oxypropionate, methyl 2-ethoxypropionate, or propyl 2-methoxy propionate, or combinations thereof. In addition, the E-FEL may contain a solvent and a base additive. In addition, the solvents may include propylene glycol monomethyl ether acetate and/or cyclohexanone.

In addition, one or more phenyl groups may be used as chromophores at wavelengths above 193 nm, and switchable properties can be provided by attaching the correct phenyl groups to the polymer.

Exemplary carbocyclic aryl groups may include multiple ring compounds that contain separate and/or fused aryl groups. For example, carbocyclic aryl groups may include phenyl; naphthyl including 1-naphthyl and 2-naphthyl; biphenyl; phenanthryl; anthracyl; and acenaphthyl.

Exemplary sensitizer compounds may include aromatic systems, both heteroaromatic and carobcyclic aryl, including compounds that comprise separate and/or fused multi-ring aromatic systems. In addition, sensitizer compounds may be electron rich and comprise one or more electron-donating compounds having one to about twenty carbon atoms.

Exemplary acid generating compounds may include sulfonium and iodonium compounds having a cation component that comprises one or more substituted groups of naphthyl, thienyl, or pentafluorophenyl, or a cation component that has a sulfur ring group such a thienyl, benzothiophenium, etc.

In some embodiments, an E-FEL material can be fabricated using a chemically-amplified negative component, and/or a chemically-amplified positive component. A base additive can be included, such as an amine, and a solvent that contains an ester may be included. In additional embodiments, an E-FEL material can include a photoactive component and a resin component that comprises a polymer that includes an acid-labile ester group that has an alicyclic group, a nitrile group, a lactone group, and a solubility-switching group.

The inventors contemplate a number of different polymers, new switchable BARC compositions containing these polymers and methods of using these new switchable compositions to manufacture microelectronic devices.

Different amounts of energy are required for the de-blocking processes described herein, and this required energy is known in the art as activation energy. Acid strength and/or temperature may be increased to provide larger activation energy.

Exemplary blocking groups may have an average molecular weight of about 80 (g/mol) to about 120 (g/mol), and can comprise six to eight carbon atoms. Different blocking groups can require different acid concentrations and/or different amounts of heat to dissociate from the polymer/resin.

Exemplary absorbing chromophores can include substituted and unsubstituted phenyl, and substituted and unsubstituted heterocyclic aromatic rings containing heteroatoms selected from oxygen, nitrogen, sulfur, and combinations thereof. In addition, exemplary absorbing chromophores may include compounds containing hydrocarbon aromatic rings, substituted and unsubstituted phenyl, substituted and unsubstituted anthracyl, substituted and unsubstituted phenanthryl, substituted and unsubstituted naphthyl, and substituted and unsubstituted heterocyclic aromatic rings containing heteroatoms selected from oxygen, nitrogen, sulfur, and combinations thereof.

In addition, a non-switchable BARC/ARC layer may include a dye, a chromophore, a sensitizer, an enhancer, or a color additive, or a combination thereof, and one or more of these components may be used to establish and/or change the dissolution and/or the optical properties of the BARC/ARC.

In still other examples, an E-FEL material can include a plurality of cross-linked polymeric particles having one or more chromophores. The polymeric particle can have a mean particle size from about 1 nm to about 50 nm.

In other embodiments, one or more substrates can be processed using a verified Double-Patterning (D-P) model and a verified D-P processing sequence. When a verified D-P model is used, one or more verified doubly-exposed structures can be created on a test substrate, and when the test substrate is examined, a test reference periodic structure can be used. During the examination, examination data can be obtained from the test reference periodic structure. A best estimate structure and associated best estimate data can be selected from a metrology library that includes verified structures and associated data. One or more differences can be calculated between the test reference periodic structure and the best estimate structure from the library, the differences can be compared to matching criteria, creation criteria, or product requirements, or any combination thereof. When matching criteria are used, the test reference periodic structure can be identified as a member of the library, and the test substrate can be identified as a reference "golden" substrate if the matching criteria are met or exceeded. When creation criteria are used, the test reference periodic structure can be identified as a new member of the library, and the test substrate can be identified as a verified reference substrate if the creation criteria are met. When product requirement data is used, the test reference periodic structure can be identified as a verified structure, and the test substrate can be identified as verified production substrate if one or more product requirements are met. Corrective actions can be applied if one or more of the criteria or product requirements are not met. D-P-related confidence data and/or risk data can be established for the test reference structure using the test reference structure data and the best estimate structure data. For example, the evaluation library data can include goodness of fit (GOF) data, creation rules data, measurement data, inspection data, verification data, map data, confidence data, accuracy data, process data, or uniformity data, or any combination thereof.

In some examples, individual and/or total confidence values for the D-P substrate can be compared to individual and/or total confidence limits. The processing of a set of D-P substrates can continue, if one or more of the confidence limits are met, or corrective actions can be applied if one or more of the confidence limits are not met. Corrective actions can include establishing confidence values for one or more additional substrates in the set of D-P substrates, comparing the confidence values for one or more of the additional substrates to additional confidence limits; and either continuing to process the set of D-P substrates, if one or more of the additional confidence limits are met, or stopping the processing, if one or more of the additional confidence limits are not met.

In other examples, individual and/or total risk values for the D-P substrate can be compared to individual and/or total risk limits. The processing of a set of D-P substrates can continue, if one or more of the risk limits are met, or corrective actions can be applied if one or more of the risk limits are not met. Corrective actions can include establishing risk values for one or more additional substrates in the set of D-P substrates, comparing the risk values for one or more of the additional substrates to additional risk limits; and either continuing to process the set of D-P substrates, if one or more of the additional risk limits are met, or stopping the processing, if one or more of the additional risk limits are not met.

Simulated contrast data can be used to create, refine, and verify circuit design or layout rules for specific integrated circuit layers based on the predicted yield from calibrated hot-spot measurements. Simulated metrology data can be generated by applying Maxwell's equations and using a numerical analysis technique to solve Maxwell's equations.

In some embodiments, simulation models can be created that quantify one or more of the relationships between E-FEL data and defect generation. These E-FEL simulation models can be calibrated from a specific set of processes and can be used to produce the higher yields.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed:

1. A method of processing a substrate comprising:
receiving a plurality of un-patterned substrates and associated substrate data, each un-patterned substrate having one or more previously-created layers thereon;
depositing at least one target layer on the one or more previously-created layers;
depositing a bottom anti-reflective coating (BARC) layer on the at least one target layer on a first set substrates;
depositing an Electric-Field Enhancement Layer (E-FEL) on the BARC layer, wherein the E-FEL comprises a non-light sensitive masking material;
depositing a first Active-Species layer on the E-FEL, wherein the first Active-Species layer comprises a first light sensitive masking material;
depositing a first topcoat layer on the first Active-Species layer;
exposing the first Active-Species layer using a first reticle and a first radiation source, wherein a first pattern of first charged species regions are created in the first Active-Species layer;
creating a first enhancement pattern in the E-FEL by establishing a first voltage difference across the first Active-Species layer and the E-FEL, wherein a plurality of first soluble regions are created in a single-patterned E-FEL by transferring the first pattern in the first Active-Species layer to the single-patterned E-FEL;
removing the first topcoat layer and the first Active-Species layer;
depositing a second Active-Species layer on the single-patterned E-FEL having the first pattern, wherein the second Active-Species layer comprises a second light sensitive masking material;
depositing a second topcoat layer on the second Active-Species layer;
exposing the second Active-Species layer using a second reticle and a second radiation source, wherein a second pattern of second charged species regions are created in the second Active-Species layer;
creating a second enhancement pattern in the E-FEL by establishing a second voltage difference across the second Active-Species layer and the E-FEL, wherein a plurality of second soluble regions are created in a double-patterned E-FEL by transferring the second pattern in the second Active-Species layer to the double-patterned E-FEL; and
developing the first soluble regions and the second soluble regions, wherein a first set of double-patterned substrates are created.

2. The method of claim 1, further comprising:
obtaining evaluation data for at least one of the first set of double-patterned substrates, wherein the evaluation data includes particle data, damage data, bridging data, critical dimension (CD) data, sidewall angle (SWA) data, thickness data, processing data, or reflectance data, or any combination thereof;
identifying the first set of double-patterned substrates as verified substrates when the evaluation data is less than a first double-patterning (D-P) limit; and performing a corrective action when the evaluation data is not less than the first D-P limit.

3. The method of claim 2, wherein performing the corrective action comprises removing the double-patterned E-FEL on one or more of the first set of double-patterned substrates, cleaning one or more of the first set of double-patterned substrates, washing one or more of the first set of double-patterned substrates, rinsing one or more of the first set of double-patterned substrates, or heating one or more of the first set of double-patterned substrates, or any combination thereof.

4. The method of claim 1, wherein a bottom conductive layer is deposited on one or more of the plurality of un-patterned substrates before the BARC layer is deposited.

5. The method of claim 1, wherein the BARC layer, the first topcoat layer, or the second topcoat layer, or any combination thereof comprises one or more conductive materials.

6. The method of claim 1, wherein a top anti-reflective coating (TARC) layer is deposited on the first topcoat layer and/or on the second topcoat layer.

7. The method of claim 1, wherein a layer of purified HEXAMETHYLDISILAZANE (HMDS) is deposited before the BARC layer is deposited, and/or before the E-FEL is deposited.

8. The method of claim 1, wherein the first pattern of first charged species regions are created in the first Active-Species layer by removing at least one group from a polymer structure in at least one material in the first Active-Species layer, the first pattern of first charged species regions comprising an acid, a base, or an ion, or a combination thereof, wherein the at least one group includes a dye, a chromophore, a sensitizer, a spacer, an enhancer, a color mask, or a color additive, or a combination thereof.

9. The method of claim 1, wherein the first pattern of first charged species regions are created in the first Active-Species layer by adding at least one group to a polymer structure in at least one material in the first Active-Species layer, the first pattern of first charged species regions comprising an acid, a base, or an ion, or a combination thereof, wherein the at least one group includes a dye, a chromophore, a sensitizer, a spacer, an enhancer, a color mask, or a color additive, or a combination thereof.

10. The method of claim 1, wherein the second pattern of second charged species regions are created in the second Active-Species layer by removing at least one group from a polymer structure in at least one material in the second Active-Species layer, wherein the second pattern of second charged species regions comprises an acid, a base, or an ion, or a combination thereof, wherein the at least one group includes a dye, a chromophore, a sensitizer, a spacer, an enhancer, a color mask, or a color additive, or a combination thereof.

11. The method of claim 1, wherein the second pattern of second charged species regions are created in the second Active-Species layer by adding at least one group to a polymer structure in at least one material in the second Active-Species layer, wherein the second pattern of second charged species regions comprises an acid, a base, or an ion, or a combination thereof.

12. The method of claim 1, wherein the first Active-Species layer comprises a non-amplified acid-generating polymer and/or a non-amplified base-generating polymer.

13. The method of claim 1, wherein the second Active-Species layer comprises a non-amplified acid-generating polymer and/or a non-amplified base-generating polymer.

14. The method of claim 1, wherein the first voltage difference ranges from approximately 0.1 volts to approximately 5000 volts.

15. The method of claim 1, wherein the second voltage difference ranges from approximately 0.1 volts to approximately 5000 volts.

16. The method of claim 1, the first voltage difference establishing a first directed de-protection process in the E-FEL, wherein the first directed de-protection process is initiated at the top of the E-FEL below the first pattern of first charged species regions and continues in a first direction through the E-FEL, thereby creating the first soluble regions in the single-patterned E-FEL, the second voltage difference establishing a second directed de-protection process in the single-patterned E-FEL, wherein the second directed de-protection process is initiated at the top of the single-patterned E-FEL below the second pattern of second charged species regions and continues in a second direction through the single-patterned E-FEL, thereby creating the second soluble regions in the double-patterned E-FEL, the second direction being substantially parallel to the first direction.

17. The method of claim 1, the first voltage difference establishing a first directed cleaving process in the E-FEL, wherein the first directed cleaving process is initiated at the top of the E-FEL below the first pattern of first charged species regions and continues in a first direction through the E-FEL, thereby creating the first soluble regions in the single-patterned E-FEL, the second voltage difference establishing a second directed cleaving process in the single-patterned E-FEL, wherein the second directed cleaving process is initiated at the top of the single-patterned E-FEL below the second pattern of second charged species regions and continues in a second direction through the single-patterned E-FEL, thereby creating the second soluble regions in the double-patterned E-FEL, the second direction being substantially parallel to the first direction.

18. The method of claim 1, the first voltage difference establishing a first directed cross-linking process in the E-FEL, wherein the first directed cross-linking process is initiated at the top of the E-FEL below the first pattern of first charged species regions and continues in a first direction through the E-FEL, thereby creating the first soluble regions in the single-patterned E-FEL, the second voltage difference establishing a second directed cross-linking process in the single-patterned E-FEL, wherein the second directed cross-linking process is initiated at the top of the single-patterned E-FEL below the second pattern of second charged species regions and continues in a second direction through the single-patterned E-FEL, thereby creating the second soluble regions, in the double-patterned E-FEL the second direction being substantially parallel to the first direction.

19. The method of claim 1, the first voltage difference establishing a first directed de-linking process in the E-FEL, wherein the first directed de-linking process is initiated at the top of the E-FEL below the first pattern of first charged species regions and continues in a first direction through the E-FEL, thereby creating the first soluble regions in the single-patterned E-FEL, the second voltage difference establishing a second directed de-linking process in the single-patterned E-FEL, wherein the second directed de-linking process is initiated at the top of the single-patterned E-FEL below the second pattern of second charged species regions and continues in a second direction through the single-patterned E-FEL, thereby creating the second soluble regions in the double-patterned E-FEL, the second direction being substantially parallel to the first direction.

20. The method of claim 1, the first voltage difference establishing a first directed de-blocking process in the E-FEL, wherein the first directed de-blocking process is initiated at the top of the E-FEL below the first pattern of first charged species regions and continues in a first direction through the E-FEL, thereby creating the first soluble regions in the single-patterned E-FEL, the second voltage difference establishing a second directed de-blocking process in the single-patterned E-FEL, wherein the second directed de-blocking process is initiated at the top of the single-patterned E-FEL below the second pattern of second charged species regions and continues in a second direction through the single-patterned E-FEL, thereby creating the second soluble regions in the double-patterned E-FEL, the second direction being substantially parallel to the first direction.

\* \* \* \* \*